(12) United States Patent (10) Patent No.: US 12,702,050 B2
Chen et al. (45) Date of Patent: Aug. 4, 2026

(54) SEMICONDUCTOR STRUCTURE AND METHOD OF FABRICATING SAME

(71) Applicant: Taiwan Semiconductor Manufacturing Company, Hsinchu (TW)

(72) Inventors: Wei-Hao Chen, New Taipei (TW); Li-Hsien Huang, Zhubei (TW); SyuFong Li, Taoyuan (TW); Yao-Chun Chuang, Hsinchu (TW); Yinlung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 668 days.

(21) Appl. No.: 18/121,272

(22) Filed: Mar. 14, 2023

(65) Prior Publication Data

US 2024/0312857 A1 Sep. 19, 2024

(51) Int. Cl.
| | |
|---|---|
| *H10W 74/10* | (2026.01) |
| *H10W 72/20* | (2026.01) |
| *H10W 72/00* | (2026.01) |
| *H10W 74/00* | (2026.01) |
| *H10W 90/00* | (2026.01) |

(52) U.S. Cl.
CPC .......... *H10W 74/117* (2026.01); *H10W 72/20* (2026.01); *H10W 72/884* (2026.01); *H10W 74/00* (2026.01); *H10W 90/756* (2026.01)

(58) Field of Classification Search
None
See application file for complete search history.

(56) References Cited

U.S. PATENT DOCUMENTS

| | | | | |
|---|---|---|---|---|
| 10,361,119 | B1 * | 7/2019 | Motoyama | H10W 20/033 |
| 2011/0100697 | A1 * | 5/2011 | Yang | H10W 20/085 |
| | | | | 174/262 |
| 2014/0038359 | A1 * | 2/2014 | West | H10P 54/00 |
| | | | | 438/113 |
| 2021/0391413 | A1 * | 12/2021 | Chen | H10D 1/692 |
| 2023/0317641 | A1 * | 10/2023 | Lai | H10D 1/692 |
| | | | | 257/690 |

FOREIGN PATENT DOCUMENTS

| | | |
|---|---|---|
| TW | 200929491 A | 7/2009 |
| TW | 202213544 A | 4/2022 |

OTHER PUBLICATIONS

Taiwan Office Action for Application No. 11321218940 Dated: Nov. 28, 2024.

* cited by examiner

*Primary Examiner* — Cory W Eskridge
(74) *Attorney, Agent, or Firm* — Lippes Mathias LLP

(57) ABSTRACT

A method of fabricating a semiconductor device that includes a first die component and at least one second die component. The first die component includes a substrate, a dielectric layer on the substrate, and one or more metal pads positioned on the dielectric layer. The first die component further includes a passivation/bond film layer that is formed over the one or more metal pads, and one or more bond pad vias that extend through the passivation/bond film layer and contact one or more metal pads. The at least one second die component is bonded to the first die component and includes a substrate, and one or more through silicon vias, with the one or more through silicon vias contacting the one or more bond pad vias.

20 Claims, 20 Drawing Sheets

102

110

108

112
113
103

102

114

110

108

112
113
103

100

104

124
105
242
136
232
102
124
107

124
128
130
122
120
103
124

126
108
106

100

244     244     244     244

104
124
105
242
136
232
102
124
107

124
128
130
122
120
103
124

126
108
106

712

714

START

1102 — DEPOSIT METAL PAD LAYER ON DIELECTRIC OF SUBSTRATE

1104 — APPLY PHOTORESIST

1106 — PATTERN PHOTORESIST

1108 — FORM METAL PAD

1110 — REMOVE PHOTORESIST

1112 — FORM ETCH STOP LAYER

1114 — DEPOSIT PASSIVATION/BOND FILM LAYER

1116 — APPLY PHOTORESIST

1118 — PATTERN PHOTORESIST

1120 — ETCH

1122 — DEPOSIT CONDUCTIVE LAYER

1124 — FORM BOND PAD VIA ON METAL PAD

1126 — PERFORM CHEMICAL-MECHANICAL POLISHING

END

1100

SEMICONDUCTOR STRUCTURE AND METHOD OF FABRICATING SAME

BACKGROUND

The packages of integrated circuits are becoming increasingly complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, interconnected via varying bonding contacts, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
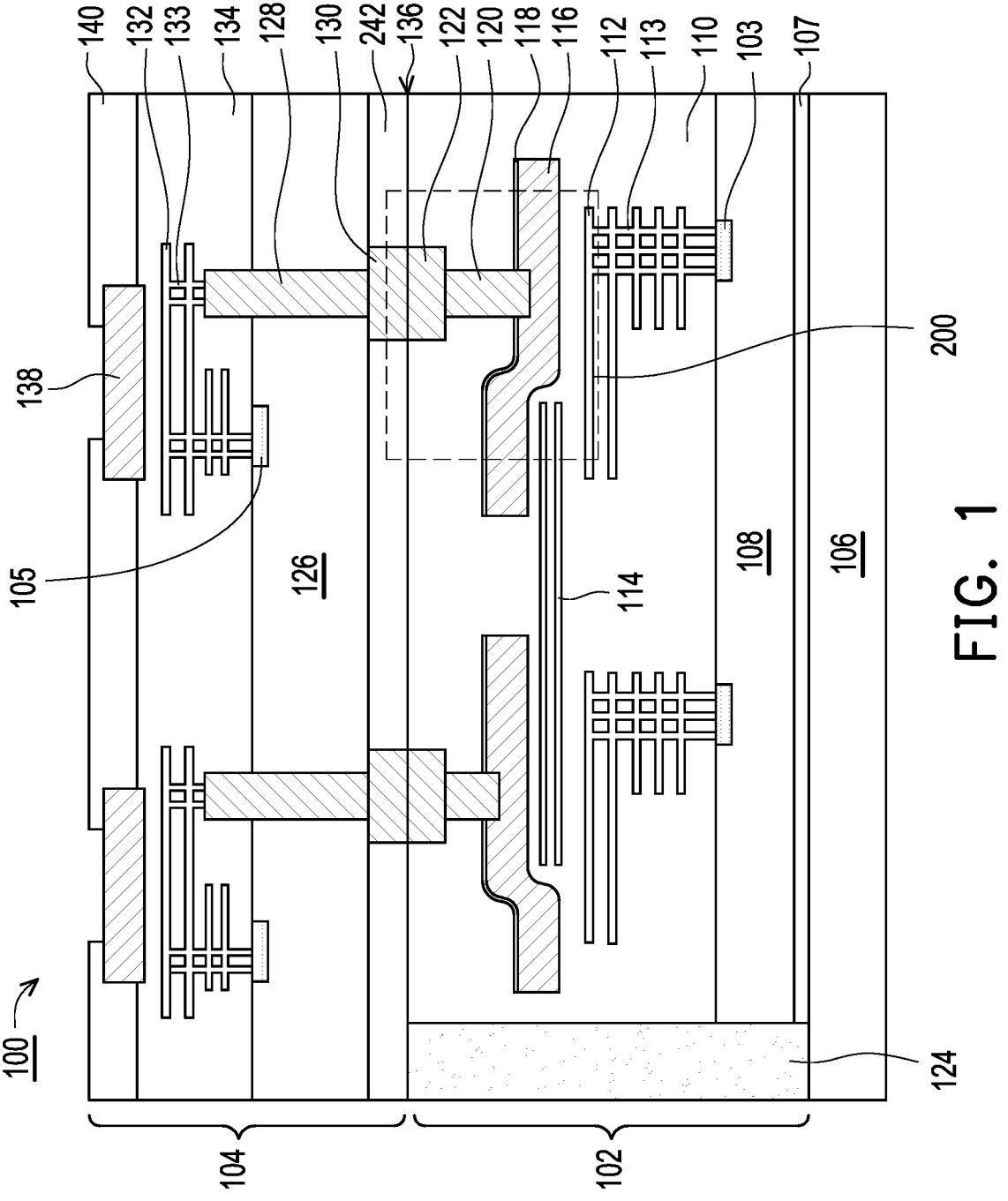
FIG. 1 is a block diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

Turning now to FIG. 1, there is shown a representative block diagram of a semiconductor device 100 in accordance with one embodiment of the subject application. As shown in FIG. 1, the semiconductor device 100 includes a first die component 102, a second die component 104, and a first die supporting carrier 106. In accordance with some embodiments, the first die supporting carrier 106 may comprise, for example and without limitation, a suitable silicon-based material, e.g., Si, SiO2, SiN, SiON, or the like. It will be appreciated that the formation of the first die component 102 and the second die component 104 may be accomplished on separate wafers (not shown) and subsequently joined together, as discussed and illustrated in greater detail below with respect to FIGS. 5A-5H.

As shown in FIG. 1, the first die component 102 includes a first die device 103 embedded or formed on a first die substrate 108. The first die component 102 may also include one or more components positioned within a dielectric layer 110 on the first die substrate 108. In accordance with some embodiments, the first die substrate 108 may comprise, for example and without limitation, a suitable silicon-based material, e.g., Si, SiO2, SiN, SiON, a tier 2 silicon, or the like. In accordance with some embodiments, the dielectric layer 110 may comprise, for example and without limitation, an extreme low-k (dielectric) (ELK) material, an oxide material, or other suitable insulative material. As illustrated in FIG. 1, the first die component 102 may be bonded to the carrier substrate 106 via a suitable bond film 107. In accordance with some embodiments, the bond film 107 may comprise, for example and without limitation, a polyimide material, or other suitable material having equivalent thermal stability, chemical resistance, and electrical properties.

The first die component 102 may further include one or more electrically conductive components, e.g., the top metal component 112 disposed therein. In accordance with one embodiment, the top metal component 112 may be implemented as electrical circuit components or contacts of a CMOS circuit. In some embodiments, the top metal component 112 corresponds to integrated circuit ("IC") components that are disposed on or over the first die substrate 108.

Suitable examples of such IC components may include, for example and without limitation, active components (e.g., transistors), passive components (e.g., capacitors, inductors, resistors, and the like), or combinations thereof. In accordance with some embodiments, the top metal component 112 may comprise, for example, a suitable conductive metal including, for example and without limitation, copper, aluminum, iron, alloys thereof, etc. The first die component 102 may further include one or more first die interconnection metals 113 disposed in contact with the top metal component 112 in the dielectric layer 110. In accordance with some embodiments, the first die interconnection metals 113 may be implemented as the same or different materials as the top metal component 112, including, for example and without limitation, copper, aluminum, iron, alloys thereof, etc.

As illustrated in FIG. 1, the first die component 102 may further include one or more MiM (metal-insulator-metal) or SHDMiM (super high-density metal-insulator-metal) structures or components 114. In some embodiments, the SHD-MiM component 114 may include one or more capacitors or other super high-density electrical components. The first die component 102 may further include one or more metal pads 116 in electrical contact with a corresponding one or more bond pad vias 120, depicted as the bond pad via landing 200, discussed in greater detail below with respect to FIGS. 2A-2B. In accordance with some embodiments, the metal pads 116 may comprise any suitable conductive material including, for example and without limitation, Al, Fe, Cu, Al—Cu, alloys thereof, or any other suitable material, as will be appreciated by the skilled artisan. In some embodiments, the composition of the top metal component 112 and the metal pad 116 may each be distinct materials, in accordance with the requirements of the first die component 102 and/or the semiconductor device 100. For example, in one embodiment, the top metal component 112 may be implemented as a copper (Cu) metal or metal alloy and the metal pad 116 may be implemented as an aluminum (Al) metal or metal alloy.

The illustration of the first die component 102 includes an etch stop layer 118 formed on the one or more metal pads 116. A more detailed discussion of the etch stop layer 118 is provided below with respect to FIGS. 4A-4J. As depicted in FIG. 1, the bond pad vias 120 are coupled to a corresponding bond pad metal component 122, enabling electrical coupling of the first die component 102 to the second die component 104. In some embodiments, the bond pad vias 120 and the bond pad metal components 122 may comprise any suitable conductive material including, for example and without limitation, Al, Fe, Cu, Al—Cu, alloys thereof, or any other suitable material, as will be appreciated by the skilled artisan.

As referenced above, the semiconductor device 100 further includes a second die component 104 electrically coupled to the first die component 102. As shown in FIG. 1, the second die component 104 includes one or more second die device(s) 105 embedded or formed on a second die substrate 126. The second die component 104 may include a second die substrate 126. In accordance with some embodiments, the second die substrate 126 may comprise, for example and without limitation, a suitable silicon-based material, e.g., Si, SiO2, SiN, SiON, a tier 1 silicon, or the like. As shown in FIG. 1, the second die component 104 includes one or more through silicon vias (TSVs) 128 extending through the substrate 126. The TSVs 128 may include corresponding backside bond pad metal or TSV pads 130 (representative of the connections available on the backside of the second die component 104) configured to couple to the bond pad metal components 122 of the first die component, as illustrated in FIG. 1.

The second die component 104 depicted in FIG. 1 may further include one or more top metal components 132 coupled to the TSVs 128. As shown in FIG. 1, the second die component 104 includes a dielectric layer 134 formed on the second die substrate 126. In some embodiments, the dielectric layer 134 surrounds the one or more top metal components 132, with the TSVs extending through the dielectric layer 134 as shown in FIG. 1. As discussed above, the one or more top metal components 132 may be implemented as electrical circuit components or contacts of a CMOS circuit. In some embodiments, the top metal component 132 corresponds to integrated circuit ("IC") components that are disposed on or over the second die substrate 126. Suitable examples of such IC components may include, for example and without limitation, active components (e.g., transistors), passive components (e.g., capacitors, inductors, resistors, and the like), or combinations thereof. In accordance with some embodiments, the top metal component 132 may comprise, for example, a suitable conductive metal including, for example and without limitation, copper, aluminum, iron, alloys thereof, or the like. The second die component 104 may further include one or more second die interconnection metals 133 disposed in contact with the top metal component 132 in the dielectric layer 134. In accordance with some embodiments, the second die interconnection metals 133 may be implemented as the same or different materials as the top metal component 132, including, for example and without limitation, copper, aluminum, iron, alloys thereof, etc.

The second die component 104 may further include one or more metal pads 138 positioned on or in the dielectric layer 134. In accordance with some embodiments, the metal pads 138 may comprise any suitable conductive material including, for example and without limitation, Al, Fe, Cu, Al—Cu, alloys thereof, or any other suitable material, as will be appreciated by the skilled artisan. In some embodiments, the composition of the top metal component 132 and the metal pad 138 may each be distinct materials, in accordance with the requirements of the second die component 104 and/or the semiconductor device 100. For example, in one embodiment, the top metal component 132 may be implemented as a copper (Cu) metal or metal alloy and the metal pad 138 may be implemented as an aluminum (Al) metal or metal alloy.

The second die component 104 may further include a passivation layer 140 formed on the dielectric layer 134, wherein a portion of the metal pads 138 are exposed therethrough. The semiconductor device 100 of FIG. 1 may further include a hybrid bond interface 136, located between the first die component 102 and the second die component 104. In some embodiments, the hybrid bond interface 136 may be implemented as an oxide/oxide bond, however the skilled artisan will appreciate that other suitable bonding materials and interfaces may be used in accordance with varying embodiments of the subject application.

Figure 2A:
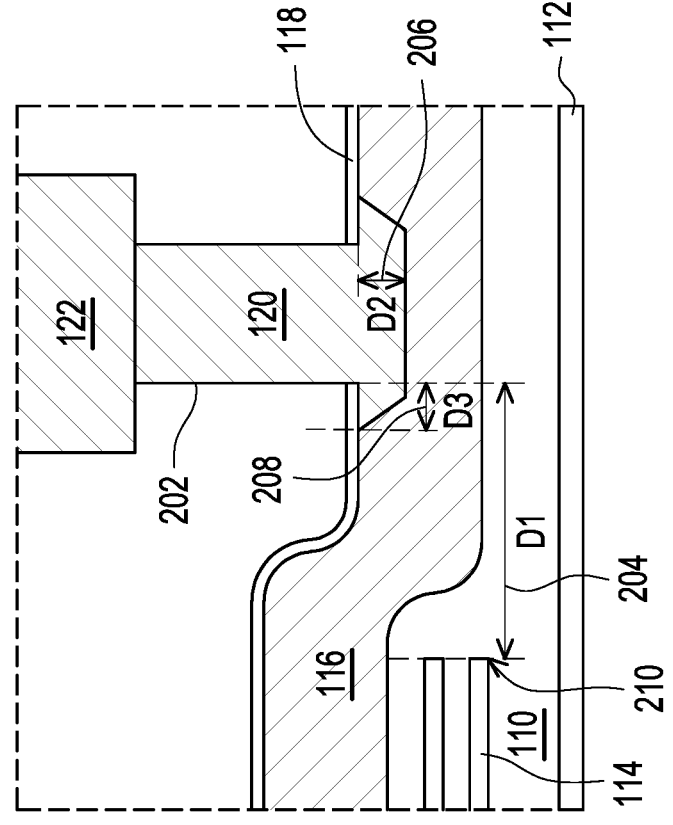
FIGS. 2A-2B are block diagrams illustrating a bond pad via landing on metal pad in accordance with some embodiments.
Figure 2B:
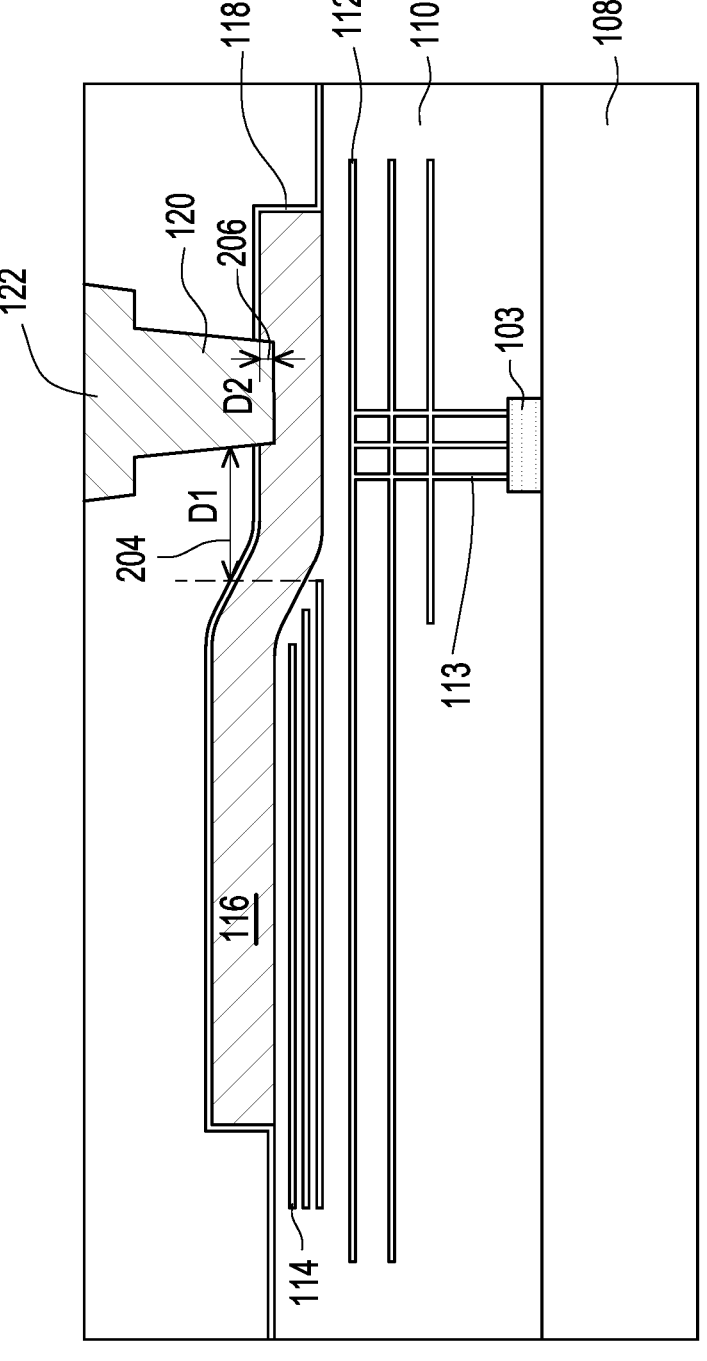
Figure 3:
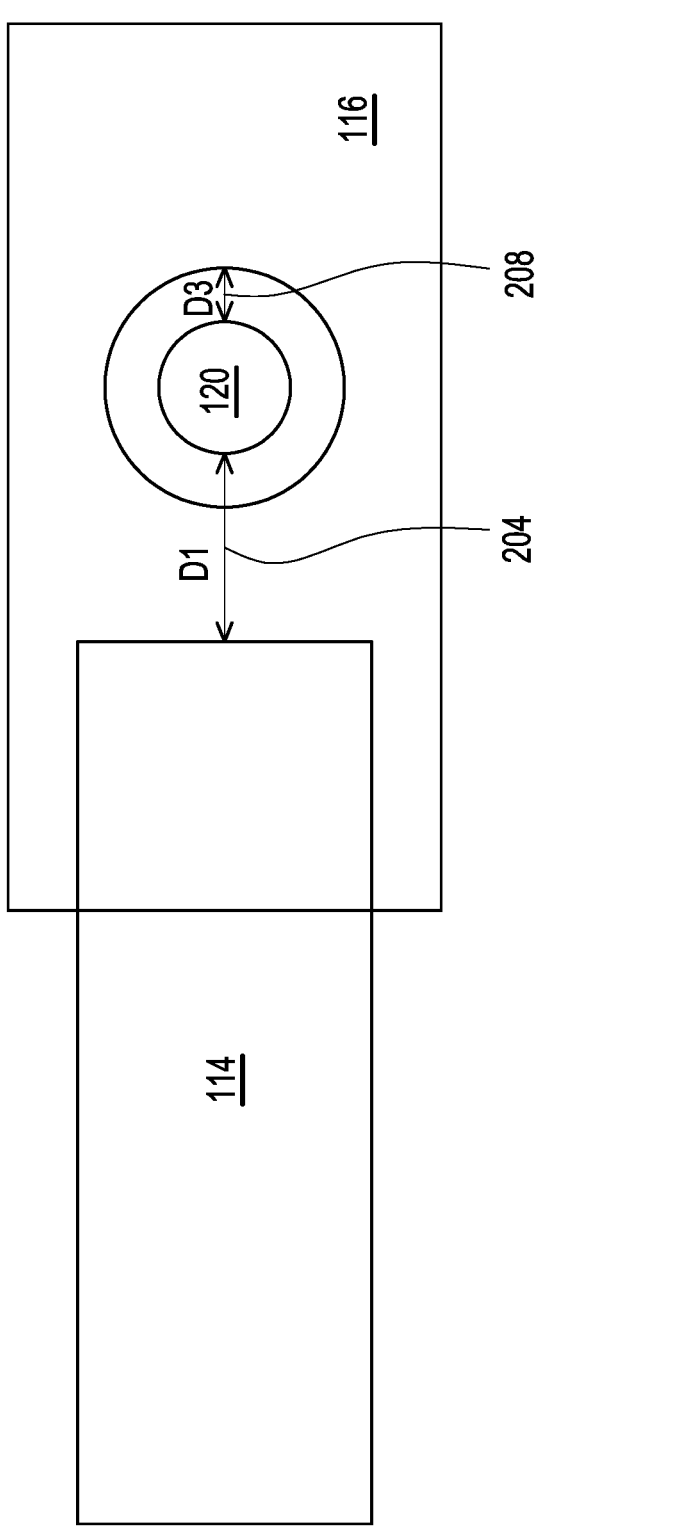
FIG. 3 is a top view of the bond pad landing in accordance with some embodiments.

Turning now to FIGS. 2A, 2B and 3, there is shown a block diagram illustrating a close-up view side-view and a top view, respectively, of the bond pad via landing 200 depicting the bond pad via 120 contacting the metal pad 116 in accordance with some embodiments. In FIGS. 2A-2B, the close-up view of the bond pad via landing 200 shows the coupling, i.e., the deposition of the bond pad via 120 on the metal pad 116 in accordance with one exemplary embodiment. As shown, the bond pad via landing 200 includes one or more dimensions relative to the coupling of the bond pad via 120 to the metal pad 116. That is, as shown in FIGS. 2A-2B, a keep out zone (KOZ) 204 having a distance "D1" between an edge of the bond pad via 120 (i.e., BPV edge 202) and an edge of the SHDMiM component 114 (i.e., SHDMiM edge 210), a metal pad recess 206 corresponding to the distance "D2" into the metal pad 116 the bond pad via 120 extends, and an metal pad lateral recess 208 corresponding to the distance "D3" the bond pad via 120 extends laterally into the metal pad 116. In some embodiments, the metal pad lateral recess 208 corresponds to the distance of bond pad material extending perpendicularly out from the edge 202 of the bond pad via 120, as illustrated in greater detail below with respect to FIG. 3. It will be appreciated that formation of a BPV landing 200 on uneven surfaces of metal pads 116 may result in high resistance caused by over etching and conductive (i.e., copper) loss post thermal budget. Optimization of the BPV landing 200 decreases reliability risks. That is, the subject embodiments enhance thermal reliability (i.e., allows the components to take more thermal) while providing high performance reliability. Stated another way, the specific design definitions of the KOZ 204 (D1 distance between SHDMiM component 114 and edge 202 of the bond pad via 120), the metal pad recess 206 (i.e., D2), and the metal pad lateral recess 208 (i.e., D3) reduce the BPV landing 200 or occupied area of the top metal component and enhance thermal reliability.

As will be appreciated, the bond pad via 120 provides communication links for chips in vertical direction to facilitate increased level of integration in packaging and it can be used in three-dimensional integrated circuit. Three-dimensional integrated circuits may be formed by stacking two dies together, with TSVs or bond pad vias 120 formed in one of the dies to connect the other die to a package substrate. Generally, such vias 120 are formed in a semiconductor wafer by initially forming an opening partially through a substrate, and filling the opening with a conductive material, such as copper. Bond pad vias 120 may be larger than other standard cells in a design, and thus impact integrated circuit performance in a greater degree. Devices in the vicinity of such vias 120 may suffer performance degradation due to the stress induced by the vias 122. To minimize such performance variation, the keep-out zone (KOZ) 208 is imposed around a via 120, such that no other devices may be placed within the KOZ 208. The larger the KOZ is, the lower the silicon area utilization is. As shown in FIGS. 2 and 3, the KOZ 204 between the SHDMiM edge 210 and the BPV edge 202 may be implemented such that D1 is in the range of greater than or equal to 0.5 μm, and in some embodiments D1 may be in the range of greater than or equal to 0.45 μm.

In accordance with some embodiments, the metal pad recess 206 may be implemented such that depth the bond pad via 120 extends into the metal pad 116, i.e., "D2", is approximately 0 μm≤D2≤0.1 μm, and in some embodiments, in the range of greater than or equal to 0.0 μm and less than or equal to 0.05 μm, i.e., 0 μm≤D2≤0.05 μm. According to some embodiments, the metal pad lateral recess 208 may be implemented such that distance the bond pad via 120 extends laterally into the metal pad 116, i.e., "D3", is approximately 0 μm≤D3≤0.1 μm, and in some embodiments, in the range of greater than or equal to 0.0 μm and less than or equal to 0.05 μm, i.e., 0 μm≤D3≤ 0.05 μm.

Turning now to FIGS. 4A-4J, there are shown cross-sectional views of stages of manufacturing a semiconductor device in accordance with some embodiments. In the following, various layers or films are deposited and patterned. The patterning of a layer may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In other embodiments, patterning of an electron-sensitive resist layer may be by way of electron beam exposure (electron beam lithography, i.e., e-beam lithography). The skilled artisan will appreciate that the foregoing are merely illustrative examples. It will be appreciated that the illustrations of FIGS. 4A-4J are non-limiting simplified example depictions of the various manufacturing stages for producing a die component 102-104 in accordance with some embodiments. For illustration purposes, the die component 102 is presented in FIGS. 4A-4J and described hereinafter.

Figure 4A:
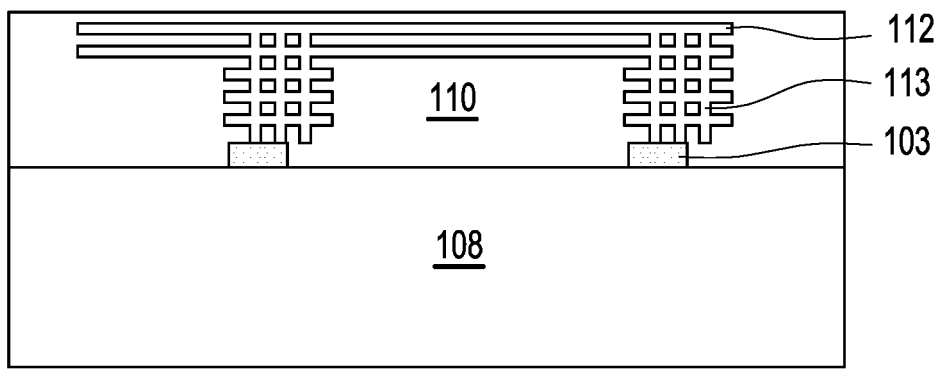
FIGS. 4A-4J are cross-sectional views of stages of manufacturing a semiconductor device in accordance with some embodiments.

As shown in FIG. 4A, a partially fabricated first die component 102 is provided. The first die component 102, at this stage of manufacture, suitably includes a first die substrate 108 and dielectric layer 110 comprising a plurality of top metal components 112. In accordance with some embodiments, the first die substrate 108 may be implemented using a suitable semiconductor substrate including, for example and without limitation, silicon, extreme low-k (dielectric) (ELK) material, undoped silicon glass (USG) material, silicon dioxide $(SiO_2)$ material, silicon nitride $(SiN_x)$ material, a complimentary metal-oxide semiconductor ("CMOS") material, or the like.

As shown in FIG. 4A, the first die component 102 utilizes one or more electrically conductive components, e.g., the top metal component 112 disposed thereon. In accordance with one embodiment, the top metal component 112 may be implemented as electrical circuit components or contacts of a CMOS circuit. In some embodiments, the top metal component 112 corresponds to integrated circuit ("IC") components that are disposed on or over the first die substrate 108. Suitable examples of such IC components may include, for example and without limitation, active components (e.g., transistors), passive components (e.g., capacitors, inductors, resistors, and the like), or combinations thereof. In other embodiments, the top metal component 112 may be implemented as a MOS device, e.g., a gate electrode, or the like. In accordance with some embodiments, the top metal component 112 may comprise, for example, a suitable conductive metal including, for example and without limitation, copper, aluminum, iron, alloys thereof, etc. The top metal component 112 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

Figure 4B:
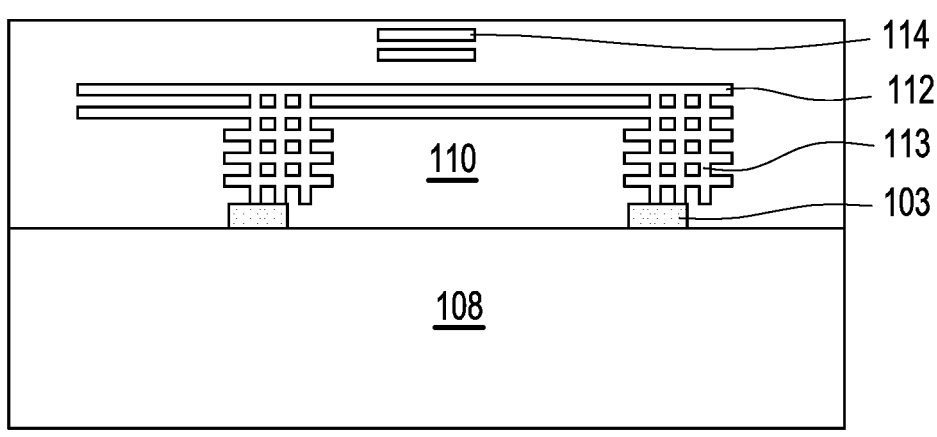

The dielectric layer 110 depicted in FIG. 4A may be formed over the top metal component 112, first die interconnection components 113 and the substrate 108 via any suitable formation methodologies. For example and without limitation, portions of the dielectric layer 110 may be deposited on the substrate 108, followed by photoresist, patterning, etching, chemical-mechanical polishing and deposition of top metal components 112, etc. In such an illustrative example, it will be appreciated that several iterations of the preceding applications of dielectric materials and top metal materials may be performed to produce the intermediate stage of the first die component 102 illustrated in FIG. 4A. In some embodiments, the dielectric layer 110 may be implemented as a suitable dielectric, i.e., insulative, material including, for example and without limitation, an oxide material (e.g., silicon dioxide (SiO$_2$) material), a nitride material (e.g., silicon nitride (SiN$_x$) material), or the like. Turning now to FIG. 4B, one or more SHDMiM components 114 are formed on the first die component 102. As shown in FIG. 4B, the one or more SHDMiM components 114 are formed above the top metal components 112. Suitable mechanisms for forming the SHDMiM components 114 may include, for example and without limitation, chemical vapor deposition (CVD), physical vapor deposition (PVD), atomic layer deposition (ALD), electroless plating, electrochemical plating, sputtering, ion metal plasma, another deposition process, or any suitable combination thereof. Thereafter, additional material of the dielectric layer 110 may be deposited on the first die component 102, as shown in FIG. 4B.

Figure 4C:
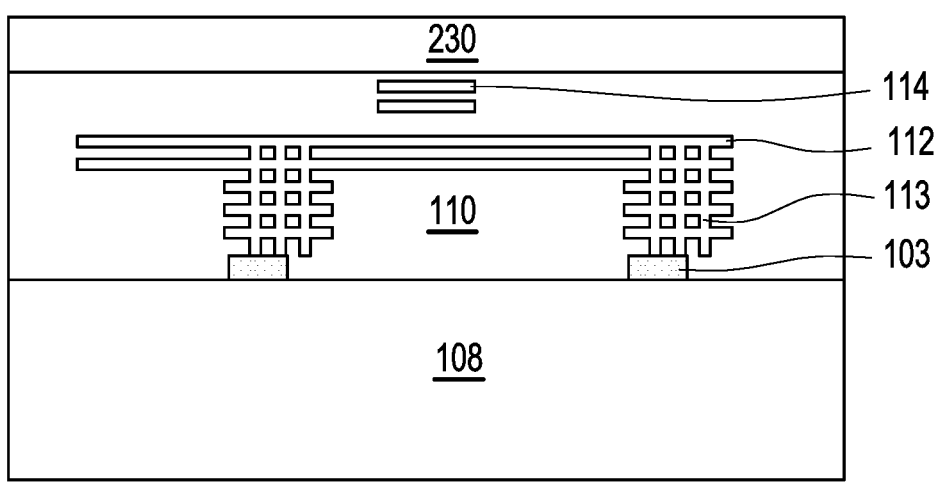

A metal pad layer 230 is then deposited on the dielectric layer 110, as illustrated in FIG. 4C, above the aforementioned SHDMiM components 114. Suitable mechanisms for forming the metal pad layer 230 may include, for example and without limitation, chemical vapor deposition (CVD), physical vapor deposition (PVD), atomic layer deposition (ALD), electroless plating, electrochemical plating, sputtering, ion metal plasma, another deposition process, or any suitable combination thereof. In accordance with some embodiments, the metal pad layer 230 may comprise any suitable conductive material including, for example and without limitation, Al, Fe, Cu, Al—Cu, alloys thereof, or any other suitable material, as will be appreciated by the skilled artisan. As referenced above with respect to FIG. 1, the composition of the top metal component 112 and the metal pad 116 may each be distinct materials, in accordance with the requirements of the first die component 102 and/or the semiconductor device 100. For example, in one embodiment, the top metal component 112 may be implemented as a copper (Cu) metal or metal alloy and the metal pad 116 may be implemented as an aluminum (Al) metal or metal alloy.

Figure 4D:
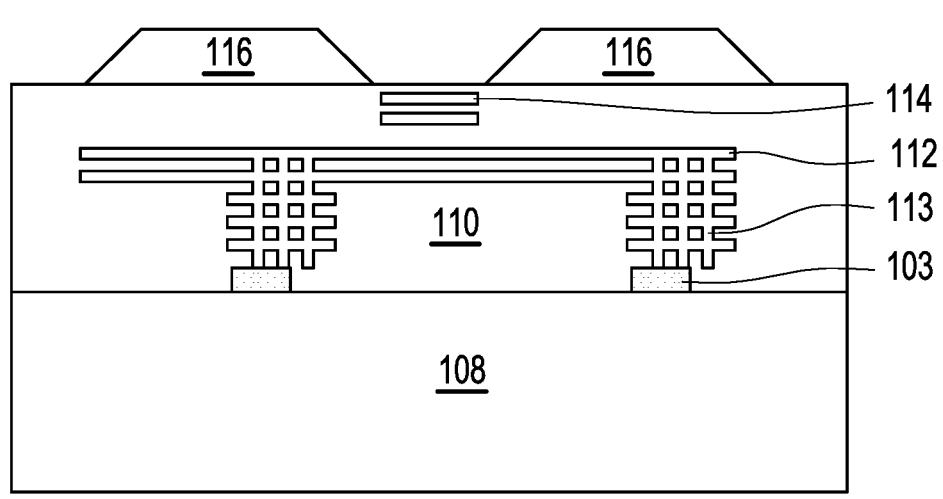

After deposition of the metal pad layer 230, a photoresist is formed/patterned on the first die component 102 to enable removal of portions of the metal pad layer 230 from the first die component 102. Thereafter, the metal pad layer 230 uncovered by the photoresist is removed via etching, including, for example and without limitation, a dry etching process, a RIE process, a wet etching process, some other etching process, or a combination of the foregoing. The photoresist is then removed after etching, resulting in the exposed metal pads 116 as shown in FIG. 4D.

Figure 4E:
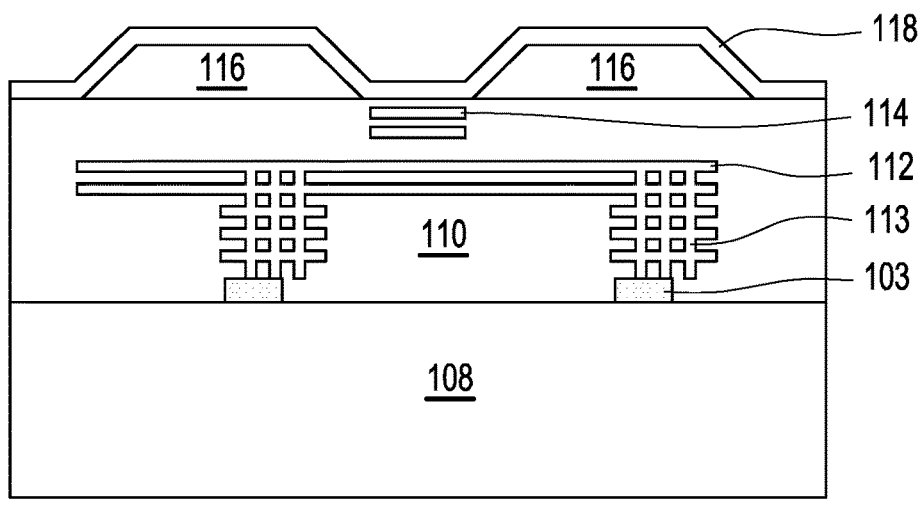

In FIG. 4E, an etch stop layer (ESL) 118 is deposited on the first die component 102. As shown in FIG. 4E, the etch stop layer (ESL) 118 comprises a suitable barrier material configured to protect the layers and components below from damage during subsequent etching processes. The etch stop layer (ESL) 118 may be implemented as tantalum oxide (TaO), tantalum (Ta), titanium (Ti), silicon nitride (SiN), and the like. It will be appreciated that the etch stop layer (ESL) 118 corresponds to a layer of material that has drastically different etching characteristics than the material to be etched, so as to stop or halt the etching processing of the layer deposited on the etch stop layer.

Figure 4F:
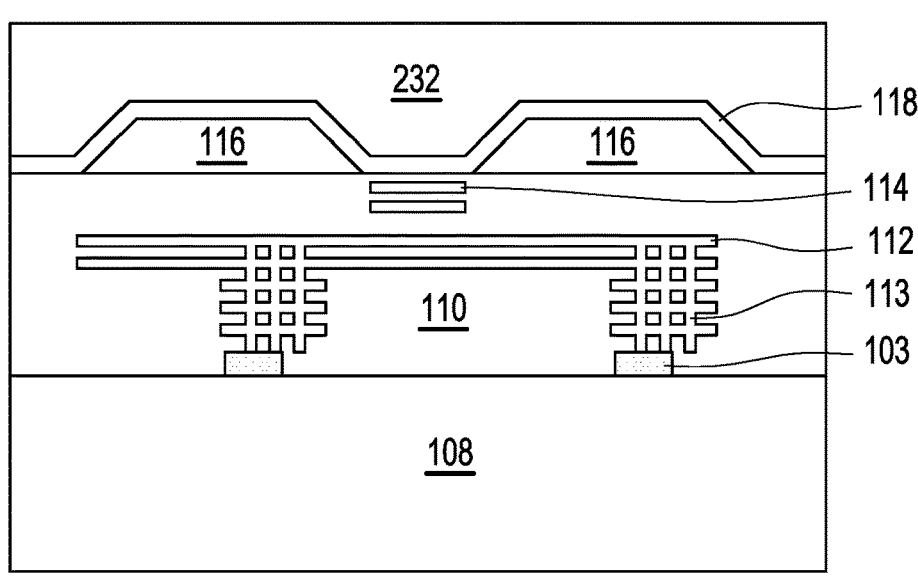

In FIG. 4F, a passivation/bond film layer 232 is formed on the etch stop layer (ESL) 118. In some embodiments, the passivation/bond film layer 232 comprises a polyimide material, or other suitable material having equivalent thermal stability, chemical resistance, and electrical properties. It will be appreciated that the stage of formation of the first die component 102 illustrated in FIG. 4F depicts the results of the coating, patterning, developing, and curing of the passivation/bond layer 232.

Figure 4G:
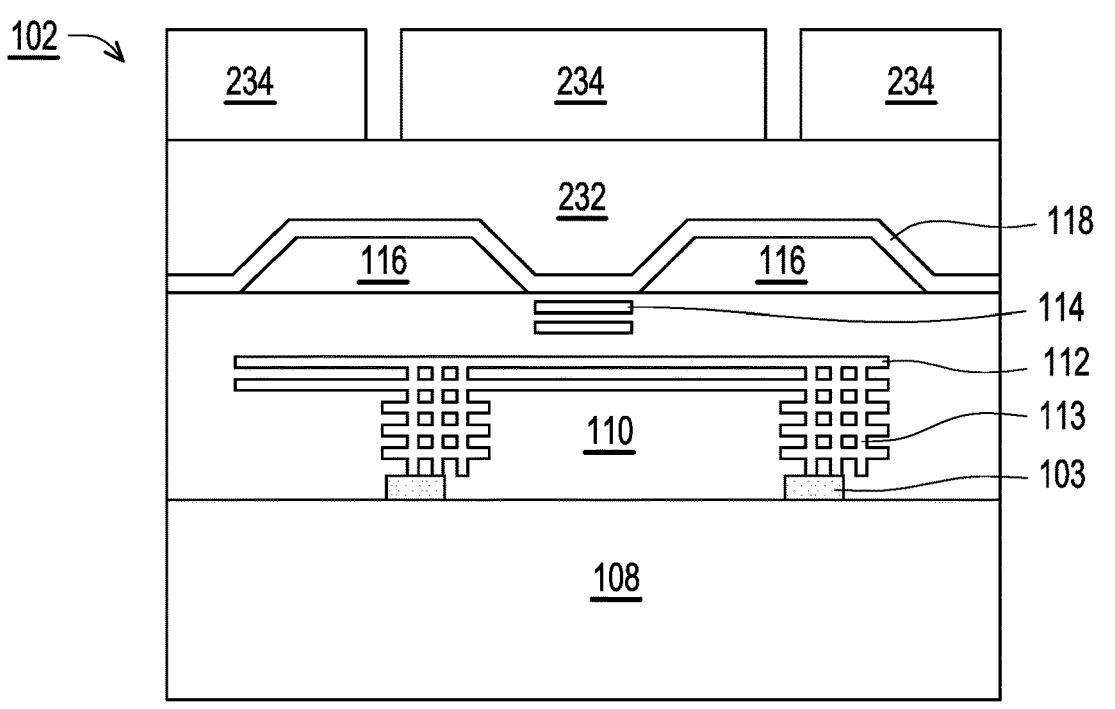

As shown in FIG. 4G, a photoresist 234 is applied and patterned on the passivation/bond layer 232 of the first die component 102. That is, the photoresist 234 is deposited and patterned on the passivation/bond layer 232 selectively covering portions thereof, leaving exposed portions proximate to the metal pads 116. That is, a portion of the passivation/bond layer 232 is left uncovered (i.e., unprotected) by the photoresist 232, which may then be accessible for subsequent removal.

Figure 4H:
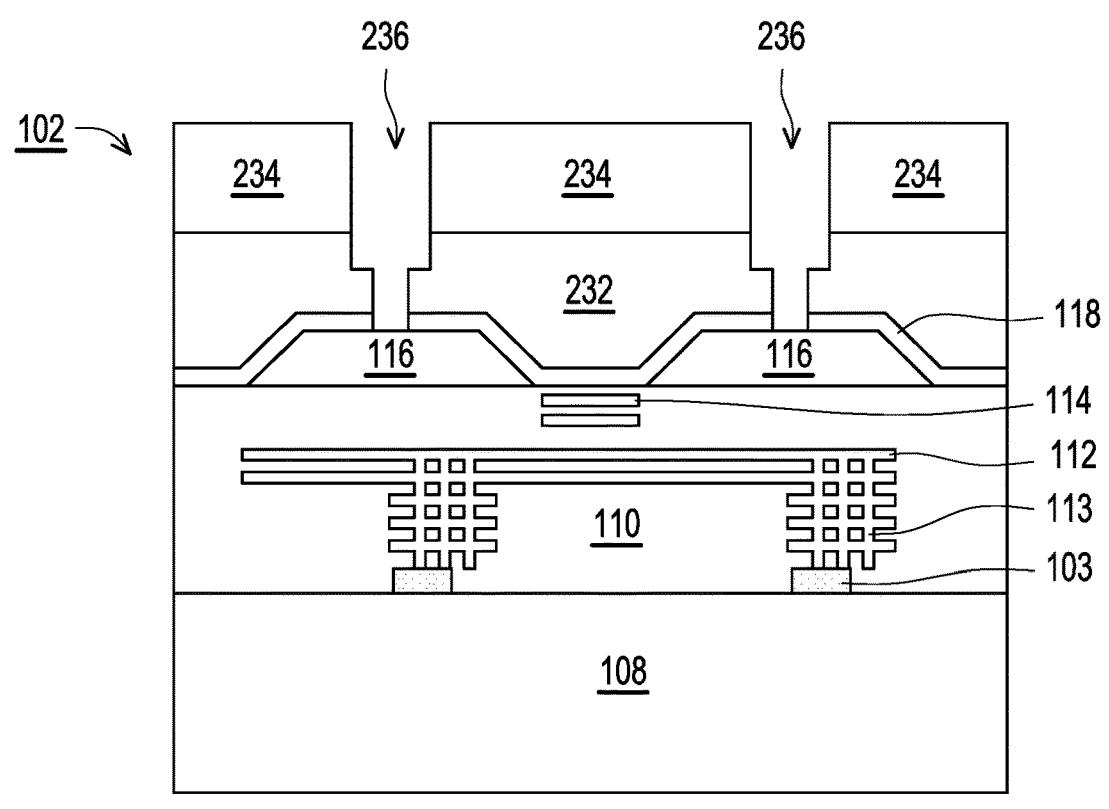

FIG. 4H provides an illustrative example of the aforementioned removal of a portion of the passivation/bond layer 232 of the first die component 102. As shown in FIG. 4H, via regions, or passageways, 236, have been formed through the passivation/bond layer 232, the etch stop layer 118, and partially into the metal pads 116. In accordance with some embodiments, removal of the unprotected portion of the passivation/bond layer 232 may be performed via an etching process implemented as a dry etching process, a RIE process, a wet etching process, some other etching process, or a combination of the foregoing. The same or different etching process may be implemented to remove the exposed portion of the etch stop layer 118, thereby exposing a portion of the metal pad 116. Subsequently, the same or different etching process, e.g., wet, dry, RIE, etc., may be performed on the exposed portion of the metal pad 116, resulting in the completed via regions 236 depicted in FIG. 4H. Thereafter, the photoresist 234 may be removed as will be understood.

Figure 4I:
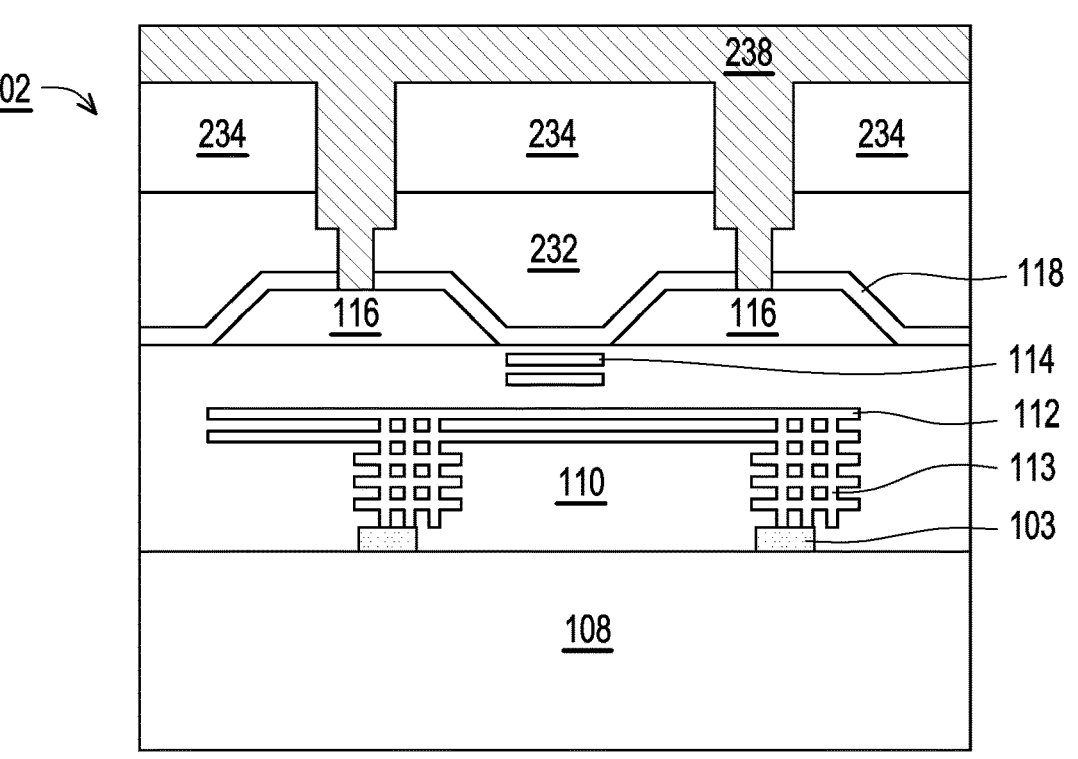

FIG. 4I illustrates the deposition of a bond pad metal layer 238, i.e., a conductive layer, on the first die component 102 in accordance with some embodiments. As shown in FIG. 4I, the bond pad metal layer 238 may be formed on the passivation/bond layer 232, extending through the via regions or via regions 236 to the metal pads 116. In accordance with some embodiments, the bond pad metal layer 238 may comprise, for example, a suitable conductive metal including, for example and without limitation, copper, aluminum, iron, alloys thereof, etc. The bond pad metal layer 238 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

Figure 4J:
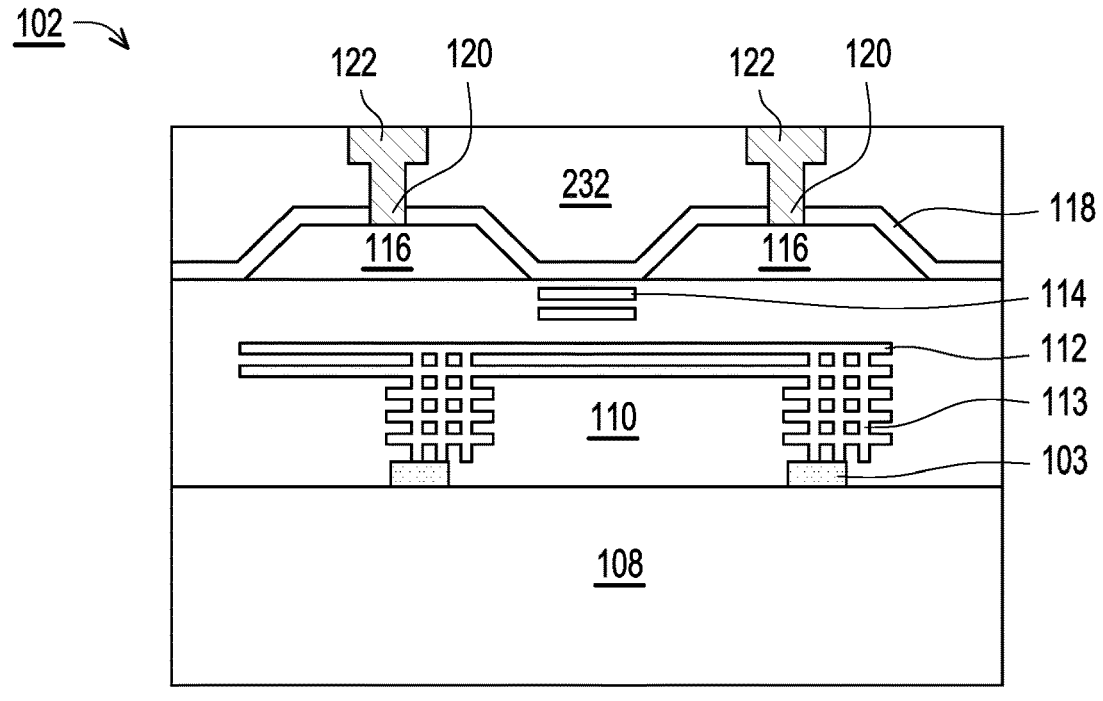

Thereafter, chemical-mechanical polishing and removal of the photoresist 234 is performed, removing the extraneous bond pad metal layer 238, resulting in the first die component 102 illustrated in FIG. 4J. As shown in FIG. 4J, the bond pad via 120 and bond pad metal 122 are thereby formed for further processing, as set forth in greater detail below with respect to FIGS. 5A-5H.

Turning now to FIGS. 5A-5H, there are shown cross-sectional views of stages of assembly of a semiconductor device 100 in in accordance with some embodiments. It will be appreciated that the formation of the semiconductor device 100 in FIGS. 5A-5H is intended solely as one example formation method, and other methods for joining the first die component 102 and the second die component 104 are capable of being implemented in accordance with varying embodiments. Thus, the process illustrated in FIGS. 5A-5H depicts the formation of the second die component 104 followed by the addition of the first die component 102 and thereafter inverting the combined structure to have the first die component 102 positioned on at the bottom and the second die component 104 positioned above the first die component 104. Variations on available processing equipment, as will be appreciated, as well as the die construction may impact, adjust or otherwise alter the formation illustrated in FIGS. 5A-5H. Accordingly, the skilled artisan will appreciate that FIGS. 5A-5H are intended solely as one illustrative example.

Figure 5A:
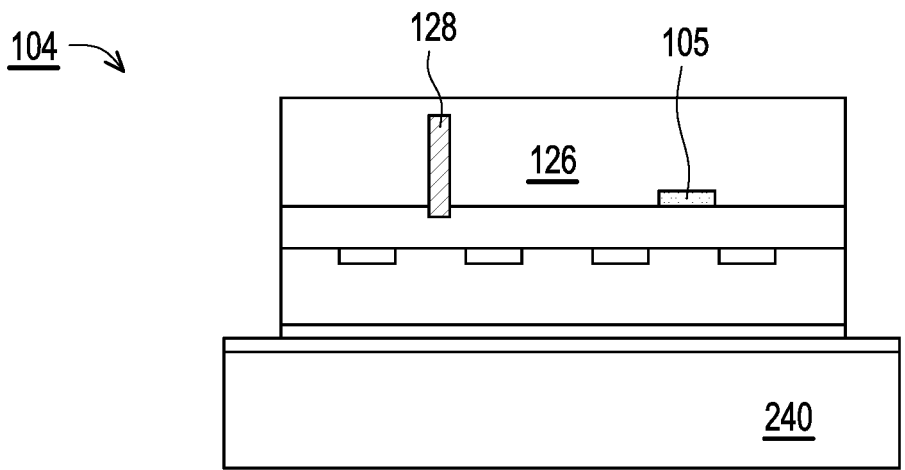
FIGS. 5A-5H are cross-sectional views of stages of assembly of a semiconductor device in in accordance with some embodiments.
Figure 5B:
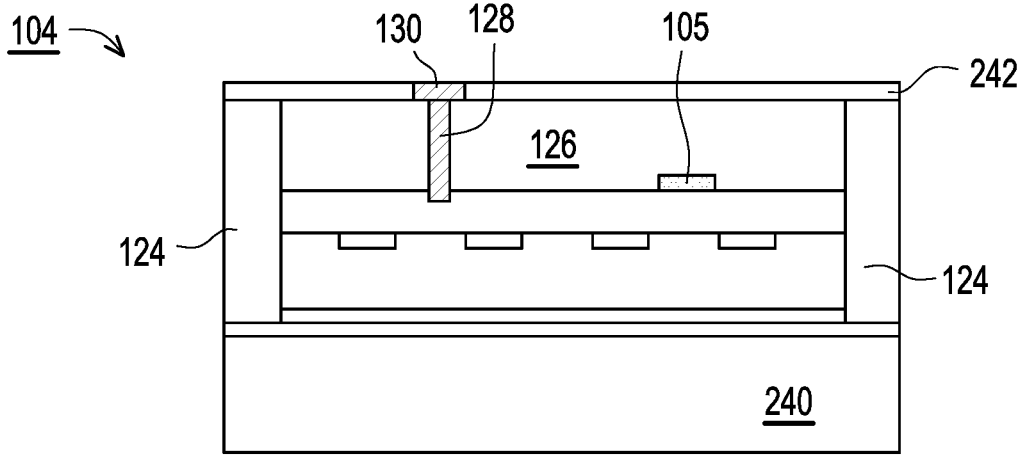

Beginning in FIG. 5A, the second die component 104 is formed, adhered to, or otherwise placed on a second die supporting carrier 240. As illustrated in FIG. 5A, the second die component 104 is shown inverted, with the second die substrate 126 located above the second die supporting carrier 240. In accordance with some embodiments, the second die supporting carrier 240 may comprise, for example and without limitation, a suitable silicon-based material, e.g., Si, SiO2, SiN, SiON, or the like. The second die component 104 depicted in FIG. 5A includes at least one TSV 128. FIG. 5B depicts a subsequent stage of manufacturing of the semiconductor device 100, wherein the second die component 104 is depicted with a suitable dielectric surround 124, a second die passivation/bond film layer 242, and TSV pads 130 formed thereon. Formation of the dielectric surround 124, the second die passivation/bond film layer 242, and the TSV pads 130 may be accomplished as described above with respect to the first die component 102 addressed in FIGS. 4A-4J. That is, similar deposition, patterning, etching, chemical-mechanical polishing, etc., may be implemented to form the above-identified components of the second die component 104 on the second die supporting carrier 240.

Figure 5C:
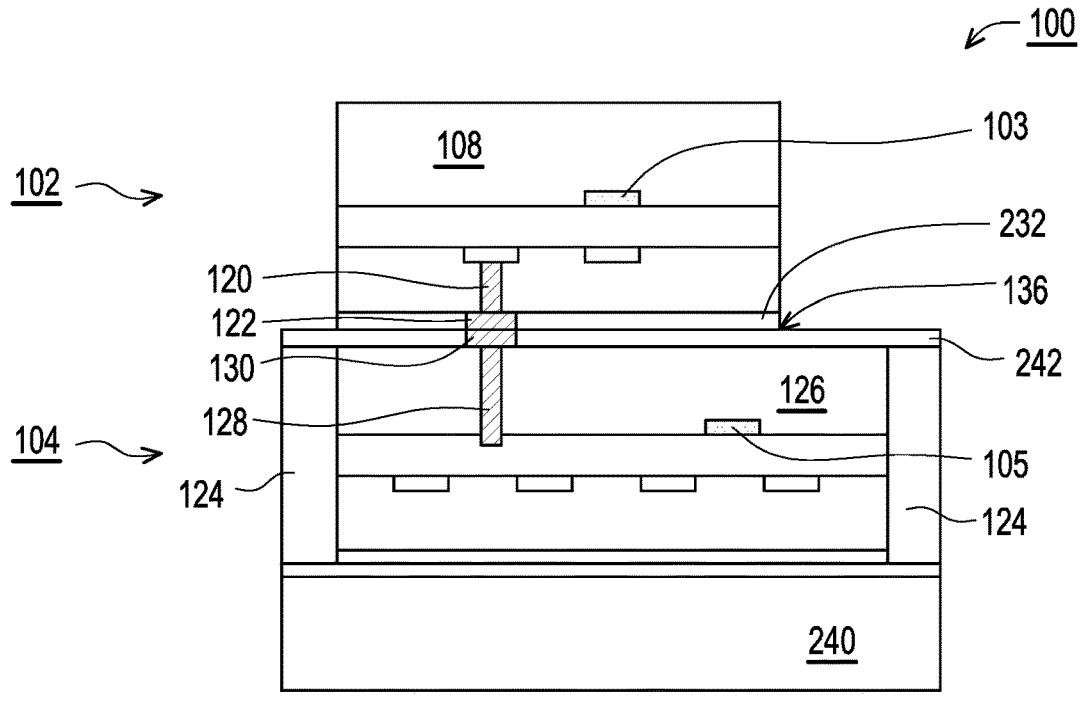

FIG. 5C illustrates the bonding of the first die component 102 to the second die component 104 in accordance with some embodiments. As shown in FIG. 5C, the bond pad metal 122 of the first die component is in contact with the TSV pad 130. The passivation/bond film layer 232 of the first die component 102 and the passivation/bond film layer 242 of the second die component 104 are joined together via the hybrid bond interface 136, as illustrated in FIG. 5C. It will be appreciated that the interconnectivity of the first die component 102 and the second die component 104 is illustrated in the "stacking" of the first die component 102 on the second die component 104 with the corresponding pads 122 and 130 forming electrical connectivity therebetween.

Figure 5D:
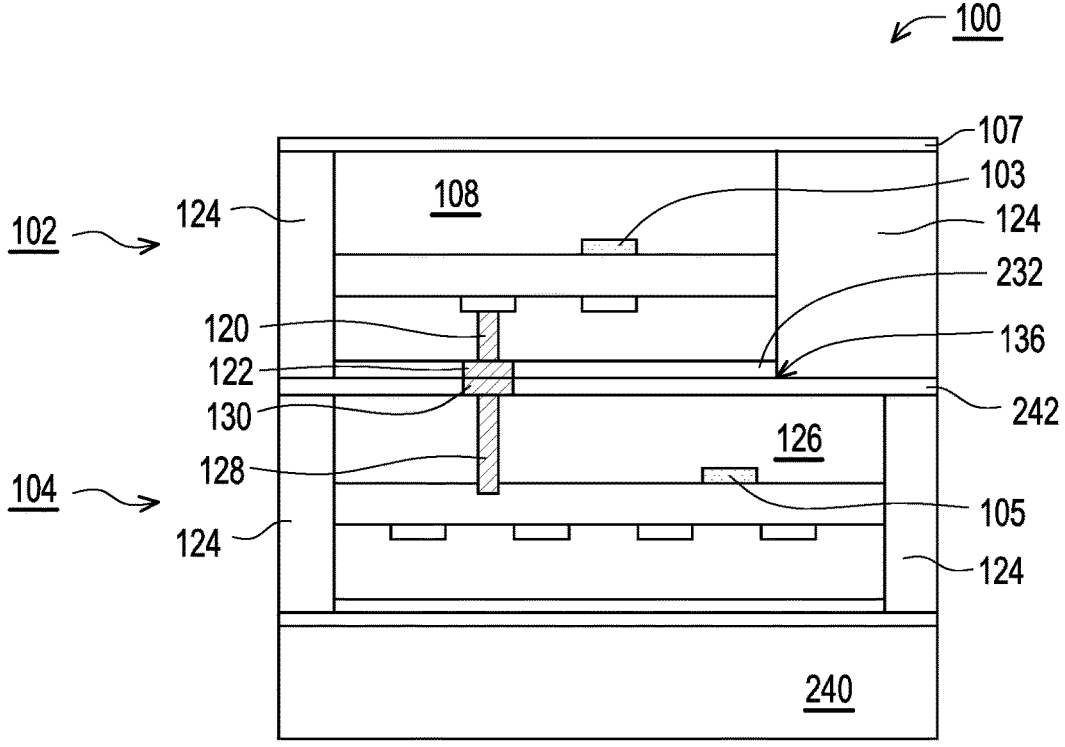

A dielectric surround fill 124 is applied to the first die component 102, as illustrated in FIG. 5D. That is, the dielectric surround fill 124 is deposited, patterned, etc., on the first die component 102, filling any gaps or voids due to disparate sizes between the first die component 102 and the second die component 104. Further, it will be appreciated that such a fill 124 increases the hybrid bond interface 136 between the two die components 102, 104, providing increased strength, insulation, etc.

Figure 5E:
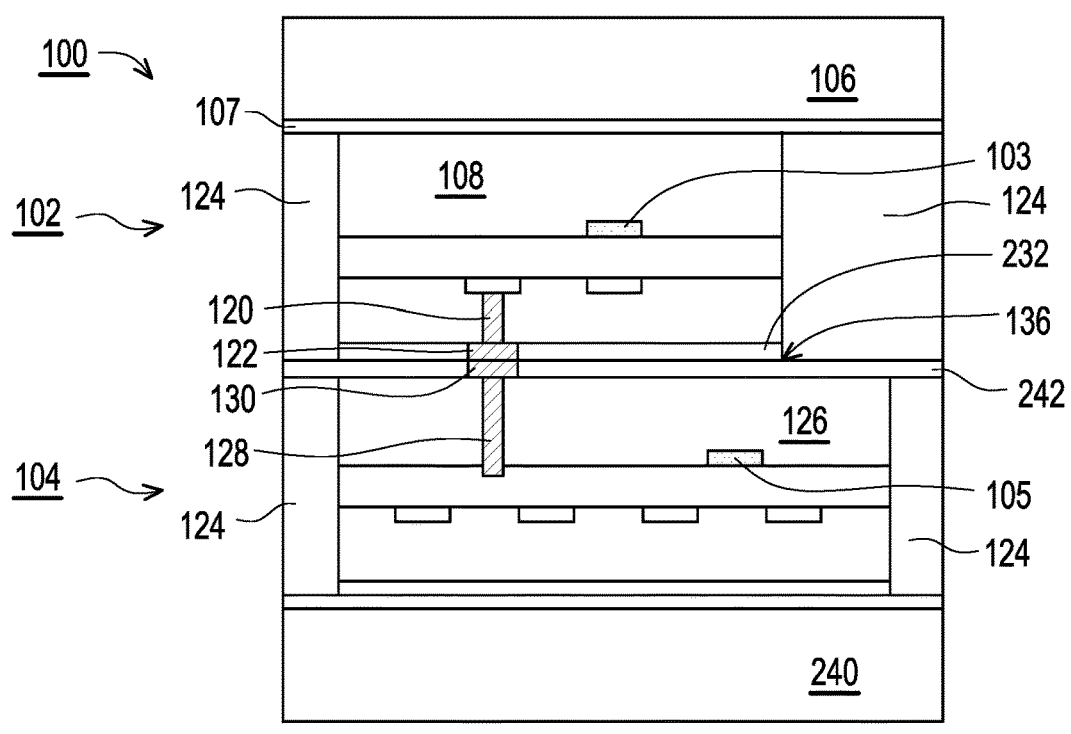
Figure 5F:
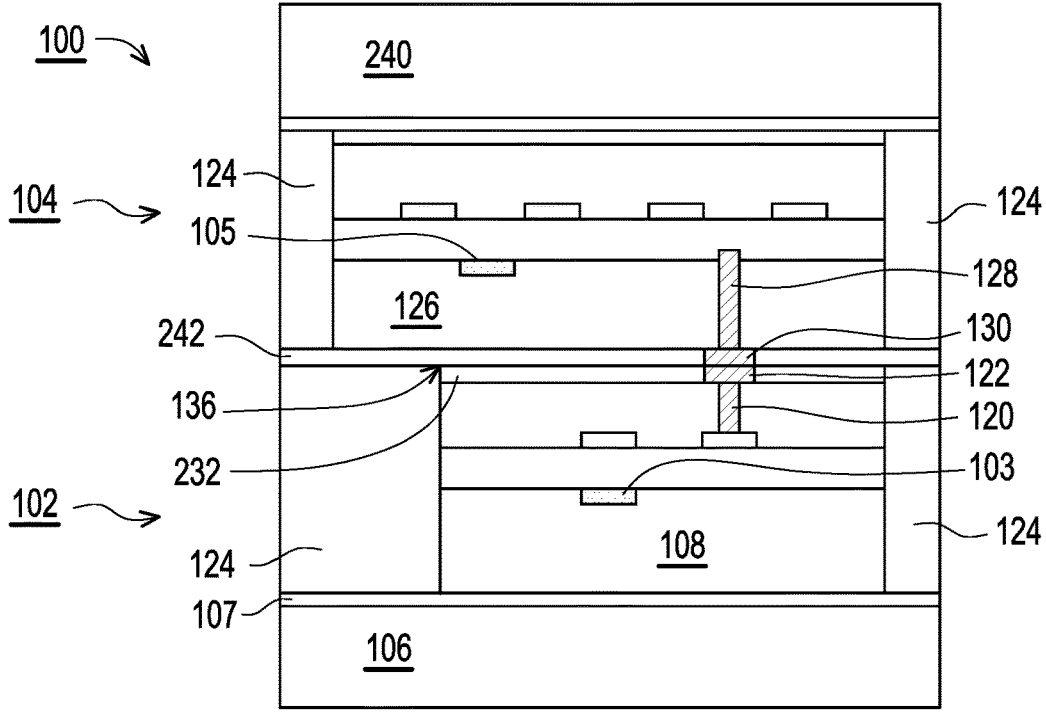

A first die supporting carrier 106 is then formed on the first die component 102, as illustrated in FIG. 5E. As referenced above, the first die supporting carrier 106 may comprise, for example and without limitation, a suitable silicon-based material, e.g., Si, SiO2, SiN, SiON, or the like. In some embodiments, the first die supporting carrier 106 and the second die supporting carrier 240 may comprise the same silicon-based material, may comprise different materials, and the like. The semiconductor device 100 formed in FIG. 5E is then inverted, placing the second die component 104 in position for further processing, as illustrated in FIG. 5F.

Figure 5G:
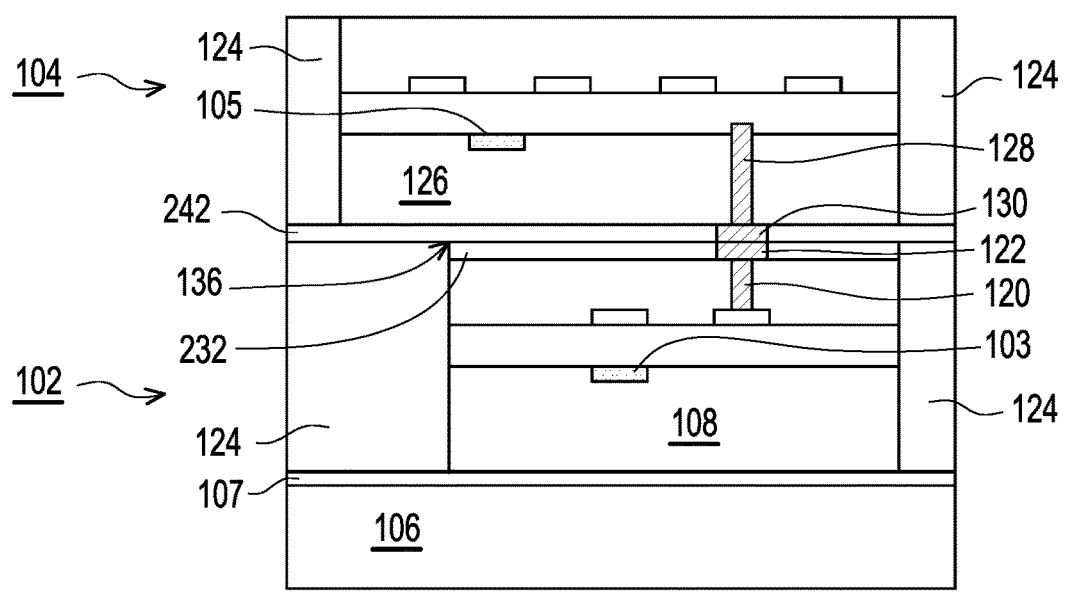
Figure 5H:
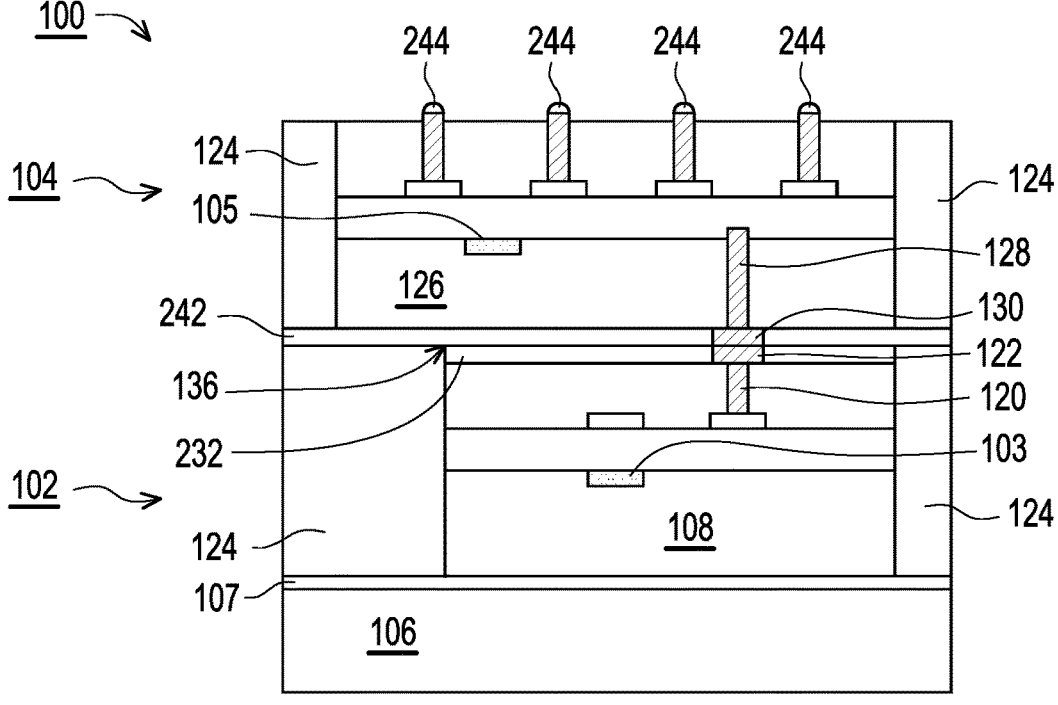

The semiconductor device 100 is then processed to remove the second die carrier 240, as shown in FIG. 5G. In accordance with some embodiments, the processing performed on the semiconductor device 100 to remove the second die carrier 240 may include, for example and without limitation, chemical-mechanical processing, etching, etc. Thereafter, a bumping process is performed on the second die component 104 of the semiconductor device 100, as shown in FIG. 5H. It will be appreciated that the bumping process may include, for example and without limitation, photoresist application, patterning, etching, deposition, removal, chemical-mechanical processing, and the like, so as to form one or more bumps 244 on the second die component 104, as shown in FIG. 5H.

Figure 6:
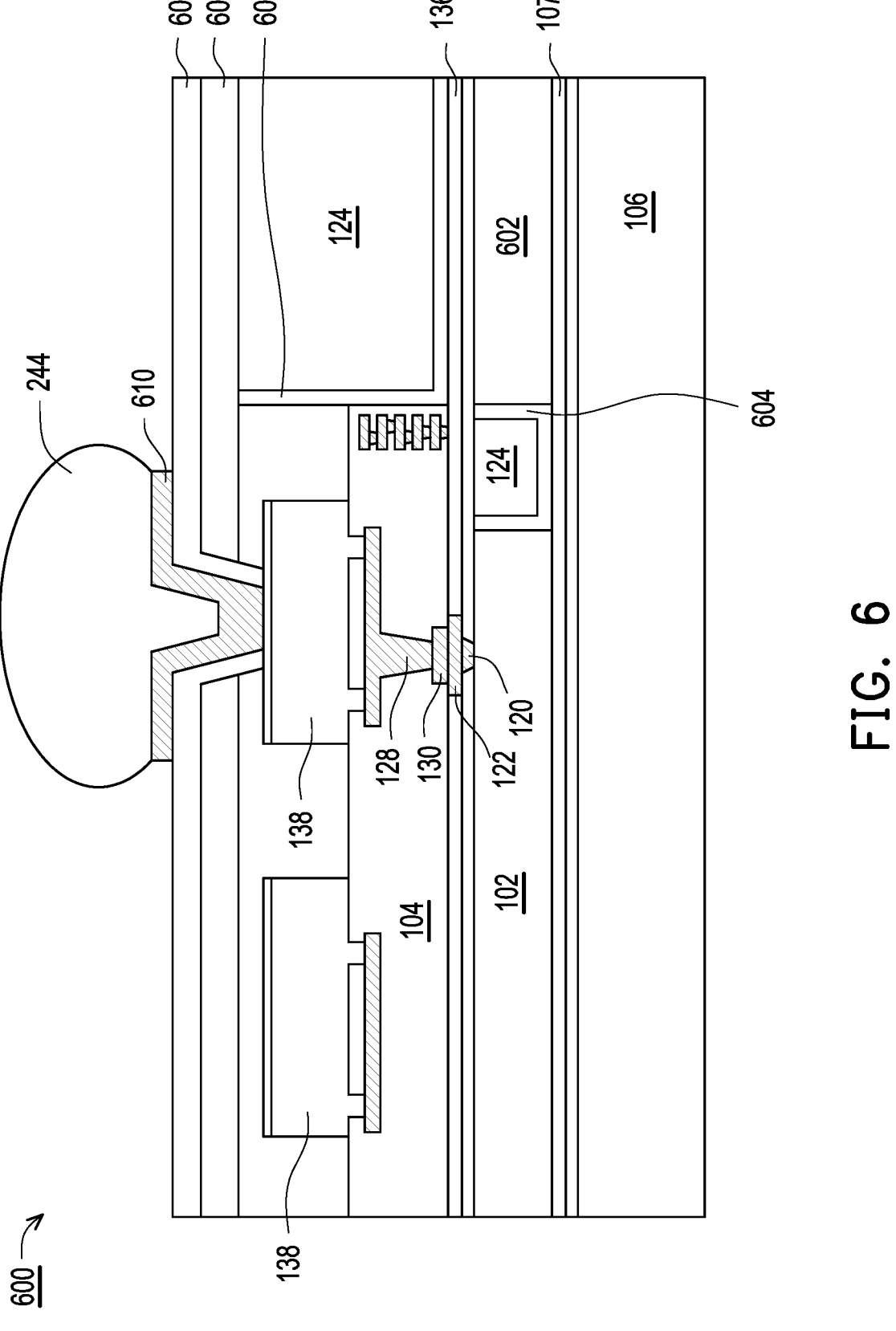
FIG. 6 is a simplified System on Integrated Chip (SoIC) in accordance with some embodiments.

Turning now to FIG. 6, there is shown a simplified System on Integrated Chip (SoIC) 600 in accordance with one embodiment described herein. As shown in the simplified cross-sectional view, the SoIC 600 includes the first die component 102 and the second die component 104 bonded together at the hybrid bond interface 136, as referenced above. The SoIC 600 of FIG. 6 further illustrates the bond pad via 120 and bond pad metal 122 of the first die component 102, contacting the TSV pad 130 of the TSV 128 of the second die component 104.

The SoIC 600 of FIG. 6 further includes the first die supporting carrier 106, on which the first die component 102 is positioned. A "dummy die" 602 is also illustrated in FIG. 6, located on the first die supporting carrier 106 and separated from the first die component 102 by dielectric surround fill 124. In accordance with one embodiment, a first seal ring 604 is formed between the first die component 102 and the dummy die 602, thereby insulating the first die component 102 therefrom. A second seal ring 605 is depicted in FIG. 6 adjacent the second die component 104. In accordance with some embodiments, the first seal ring 604 and the second seal ring 605 may correspond to the ELK/nitride/oxide interface surrounding the first die component 102 and/or the second die component 104.

As shown in FIG. 6, a first passivation layer 606 and a second passivation layer 608 are formed over the dielectric layer 134 of the second die component 104. In accordance with one embodiment, the dielectric layer 134 of the second die component 104 may be planarized prior to formation (e.g., patterning and deposition, etc.) of first passivation layer 608, as will be appreciated. In accordance with varying embodiments, the first passivation layer 606 and the second passivation layer 608 may be implemented as a suitable dielectric, i.e., insulative, material including, for example and without limitation, silicon dioxide ($SiO_2$) material, silicon nitride ($SiN_x$) material, or the like. In some embodiments, the first passivation layer 606 and/or the second passivation layer 608 may be planarized prior to formation of the bump 244, as will be appreciated.

The SoIC 600 illustrated in FIG. 6 further illustrates the metal pads 138 of the second die component 104, with at least one of the metal pads 138 contacting a bump via 610 formed through the second passivation layer 608, the first passivation layer 606, and the dielectric layer 134 of the second die component 104. In accordance with one embodiment, the bump via 610 may be formed of iron, cobalt, titanium-nitride (TiN), copper, alloys thereof, other conductive metals or metallic alloys, or the like. It will be appreciated that formation of the bump via 610 may include, for example and without limitation, deposition and patterning of a photoresist on the second passivation layer 608, etching to remove portions of the second and first passivation layer(s) 608, 606 (respectively), etching to remove portions of the dielectric layer 134 to expose a portion of the metal pad 138, deposition of the aforementioned material to form the bump via 610 and subsequent removal of photoresist and extraneous bump material. The bump 244 is then formed on the bump via 610 to enable connectively of the SoIC 600 with other components, as illustrated in the packaging examples of FIGS. 7A-7D.

Figure 7A:
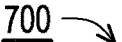
FIGS. 7A-7D are comparative examples of SoIC packaging in accordance with some embodiments.
Figure 7A:
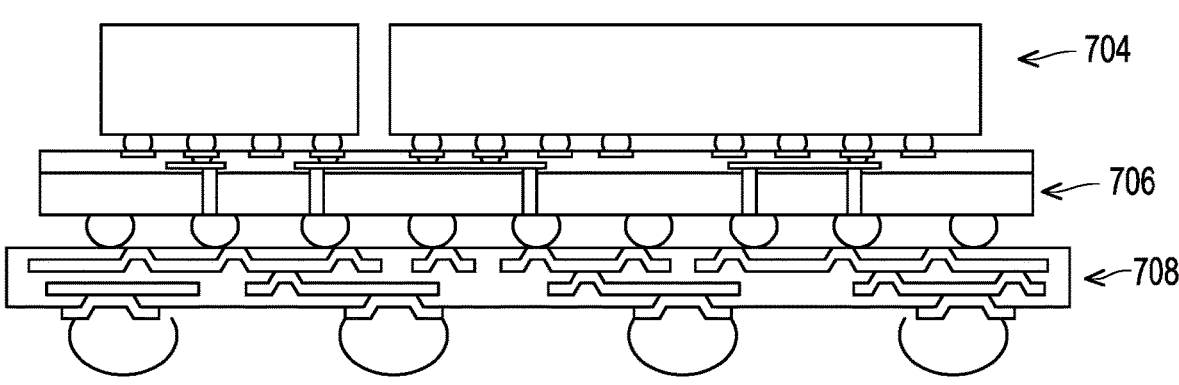
Figure 7B:
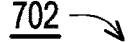
Figure 7B:
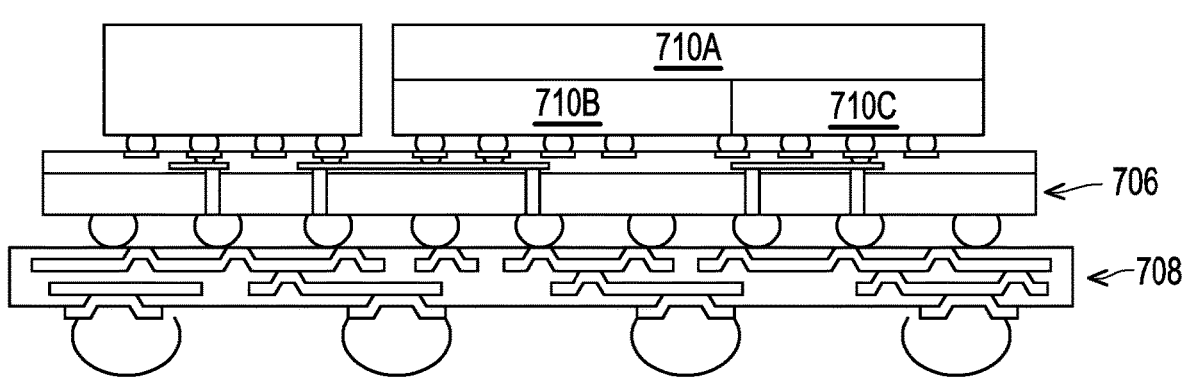

Referring now to FIGS. 7A-7D, there are shown comparative examples of SoIC packaging in accordance with some embodiments. FIG. 7A provides an illustration of a single SoIC of a Chip-on-Wafer-on-Substrate (CoWoS) 700 in accordance with one embodiment. In some embodiments, a CoWoS may correspond to a 2.5 dimensional wafer-level multi-chip packaging platform incorporating multiple dies side-by-side on a silicon interposer. As will be appreciated, the single CoWoS 700 of FIG. 7A illustrates an individual SoIC chip 704 bonded through micro-bumps (not shown) onto a silicon interposer 706, positioned between the SoIC chip 704 and a suitable circuit board substrate 708. In some embodiments, the SoIC chip 704 may be fabricated in accordance with the methods and having the structures described in greater detail above. Comparatively, FIG. 7B provides an illustration of multiple SoICs 710A, 710B, and 710C utilized in a multiple chip CoWoS 702. As shown in FIG. 7B, a first SoIC 710A is bonded (i.e., interconnected as discussed above) with a second SoIC 710B and third SoIC 710C. The second and third SoIC chips 710B-710C are suitably bonded, via micro-bumps to the silicon interposer 706, positioned between the SoIC chips 710B-710C and the aforementioned circuit board substrate 708. It will be appreciated that the multiple SoIC CoWoS 702 of FIG. 7B is illustrated as having three SoIC chips 710A-710C, however, it will be appreciated that any number of SoIC chips may be utilized in a multiple SoIC CoWoS 702 of FIG. 7B and the use of three SoIC chips 710A-710C in the figure is intended solely as a nonlimiting representative example thereof.

Figure 7C:
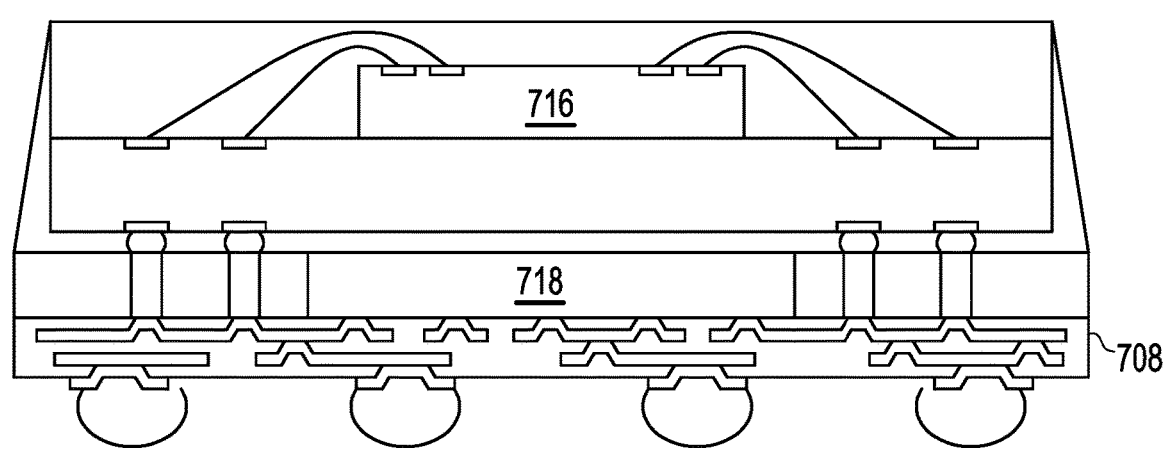
Figure 7D:
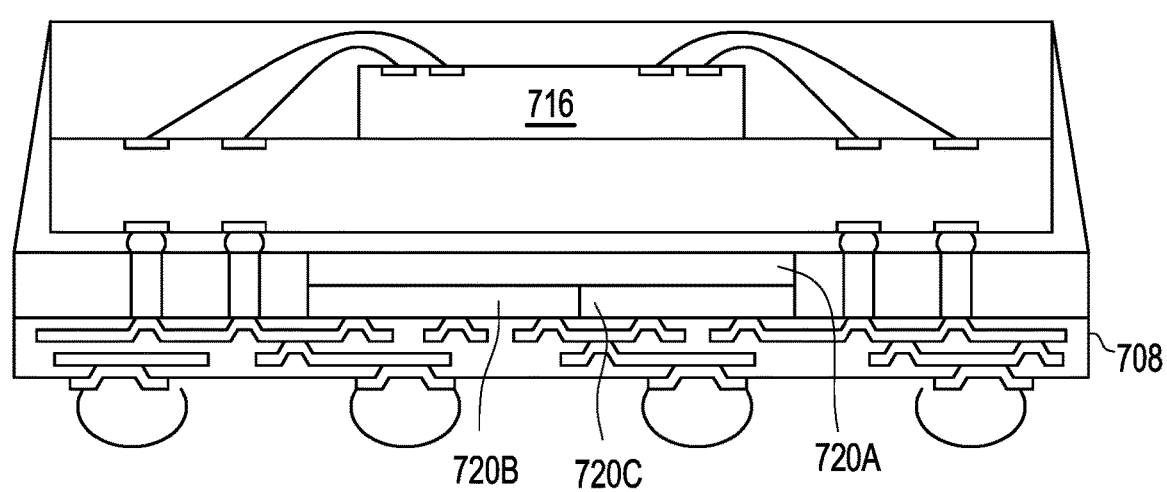

FIGS. 7C and 7D provide another illustrative and comparative example of SoIC packaging in accordance with some embodiments. FIG. 7C provides an illustration of a single SoIC of an Integrated Fan-Out Wafer Level Packaging (InFO_PoP) 712 in accordance with one embodiment. In some embodiments, a InFO_PoP may correspond to a three-dimensional wafer-level multi-chip packaging platform. In some embodiments, InFO_PoP brings single and multi-die designs together, combining multiple dies from heterogeneous processes into a compact package. That is, InFO_PoP allows chip(s) (in the form of a die) to be mounted directly on a circuit board using wafer molding and metal. This eliminates the substrate and therefore reduces the height of the mounted chip. FIGS. 7C and 7D provide one illustrative example of InFO_PoP packaging, wherein the InFO_PoP packages 712 and 714 place DRAM 716 on top of a single SoIC 718 (FIG. 7C) and on top of multiple SoICs 720A, 720B, and 720C. As will be appreciated, the single SoIC InFO_PoP 712 of FIG. 7C illustrates the individual SoIC chip 718 using one or more through-InFO via (or TIV) to communicate with the DRAM 716. The DRAM 716 and SoIC 718 are bonded to a circuit board substrate 708, as shown in FIG. 7C. In some embodiments, the SoIC chip 718 may be fabricated in accordance with the methods and having the structures described in greater detail above.

Comparatively, FIG. 7D provides an illustration of multiple SoICs 720A, 720B, and 720C utilized in a multiple chip InFO_PoP 714. As shown in FIG. 7D, a first SoIC 720A is bonded (i.e., interconnected) with a second SoIC 720B and third SoIC 720C. The second and third SoIC chips 720B-720C are suitably bonded, via micro-bumps to the aforementioned circuit board substrate 708. The DRAM 716 is attached above the SoICs 720A-720C and electrically coupled thereto using one or more TIVs. It will be appreciated that the multiple SoIC InFO_PoP 714 of FIG. 7D is illustrated as having three SoIC chips 720A-720C, however, it will be appreciated that any number of SoIC chips may be utilized in a multiple SoIC InFO_PoP 714 of FIG. 7D and the use of three SoIC chips 720A-720C in the figure is intended solely as a nonlimiting representative example thereof.

Figure 8A:
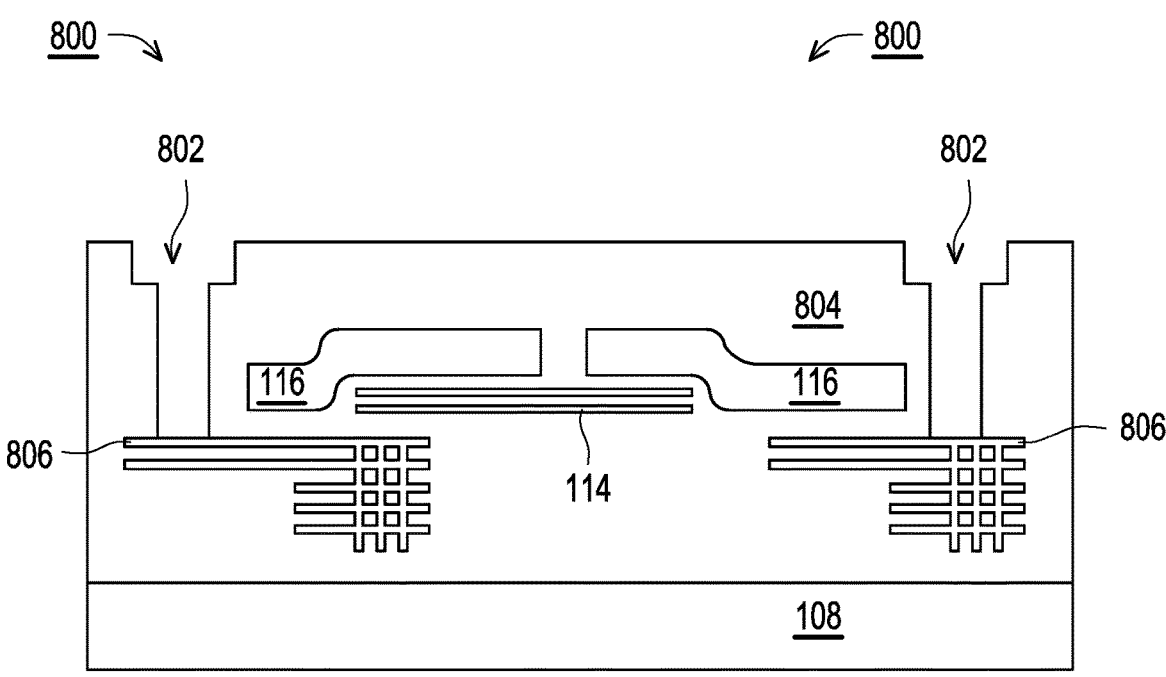
FIGS. 8A-8B are simplified cross-sectional views of a semiconductor device in accordance with some embodiments.
Figure 8B:
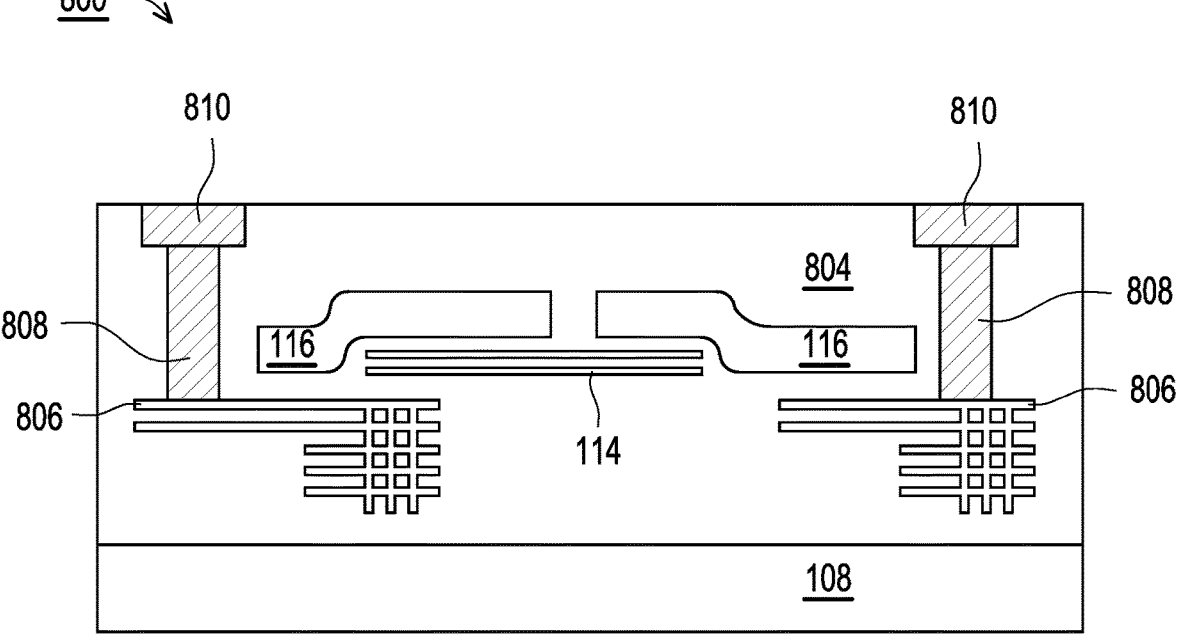

Turning now to FIGS. 8A-8B, there is shown a comparative example of another embodiment, wherein the bond pad via contacts the top metal component in contrast to the embodiments set forth in FIGS. 1-7D, discussed above. The first die component 800 depicted in FIGS. 8A-8B include the substrate 108, metal pads 116 and one or more SHDMiM components 114, as discussed in greater detail above. As illustrated in FIG. 8A, etching is performed to form via regions 802 through the dielectric layer 804 to the top metal component 806. FIG. 8B illustrates the formation of a bond pad via 808 and bond pad metal 810 in the via regions. In some embodiments, formation of the bond pad via 808 and bond pad metal 810 may be accomplished via suitable deposition methods. In one embodiment, electrochemical plating is performed to form the bond pad via 808 and bond pad metal 810. Other methods for forming the bond pad via 808 and/or bond pad metal 810 may include, for example and without limitation, chemical vapor deposition (CVD), physical vapor deposition (PVD), atomic layer deposition (ALD), electroless plating, electrochemical plating, sputtering, ion metal plasma, another deposition process, or any suitable combination thereof. In accordance with some embodiments, the bond pad via 808 and/or bond pad metal 810 may comprise any suitable conductive material including, for example and without limitation, Al, Fe, Cu, Al—Cu, alloys thereof, or any other suitable material, as will be appreciated by the skilled artisan. In some embodiments, the composition of the top metal component 806 and the bond pad via 808 and/or bond pad metal 810 may each be distinct materials or the same material, in accordance with the requirements of the semiconductor device. For example, in one embodiment, the top metal component 806 may be implemented as a copper (Cu) metal or metal alloy and the bond pad via 808 and/or bond pad metal 810 may also be implemented as a copper (Cu) metal or metal alloy.

Figure 9:
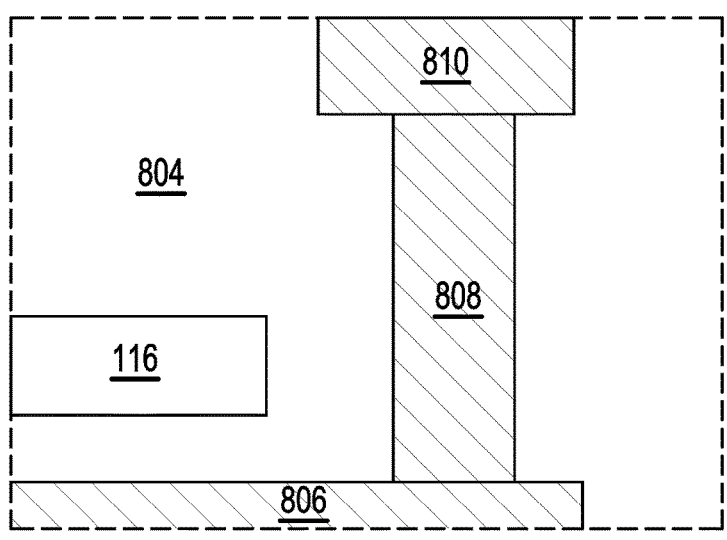
FIG. 9 is a block diagram illustrating a bond pad via landing on top metal component in accordance with some embodiments.
Figure 10:
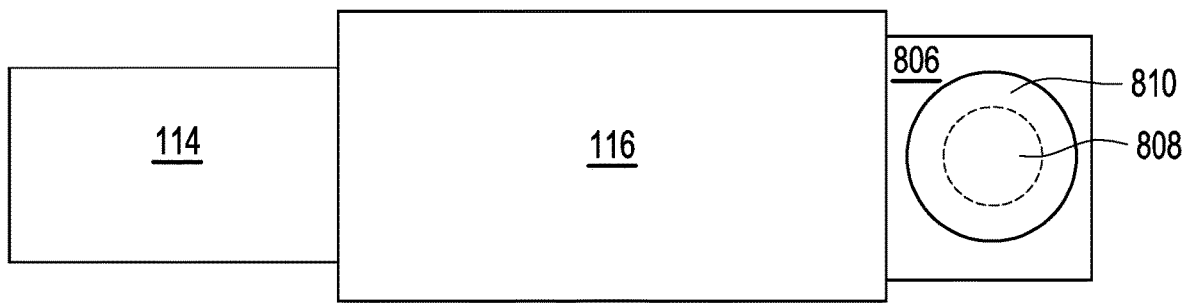
FIG. 10 is a top view of the bond pad landing in accordance with some embodiments.

Turning now to FIGS. 9 and 10, there is shown a block diagram illustrating a close-up view side-view and a top view, respectively, of the bond pad via landing directly on the top metal component 806 depicting the bond pad via 808 contacting the top metal component 806 in accordance with some embodiments. In FIG. 9, the close-up view of the bond pad via landing shows the coupling, i.e., the deposition of the bond pad via 808 directly on the top metal component 806 in accordance with one exemplary embodiment. FIG. 10 provides a top view of the embodiment of FIGS. 8A-8B. As shown in FIG. 10, the top metal component 806 extends laterally from the metal pad 812, substantially increasing the area of the top metal component 806. Such an implementation may impact size, cost, amount of material, etc., required for fabrication. Accordingly, the embodiments described above with respect to FIGS. 1-7D reduce the area of the top metal component required in the semiconductor device 100, as well as reducing the depth required for etching the bond pad via 120. That is, the embodiments set forth above in FIGS. 1-7D reduce the size and amount of top metal formed in the semiconductor device 100 by having the bond pad via 120 connect to the metal pad 116. Thus, the top metal component need not extend past the metal pad 116 to provide a landing for the bond pad via 120. See, for example, the example embodiments set forth in FIG. 3 in comparison to FIG. 10, wherein the top metal component 112 of FIG. 3 is not visible (i.e., reduced in size and amount) with the BPV landing 200 on the metal pad 116 in contrast to the increased size (and amount) of top metal component 806 extending past the metal pad 116 in FIG. 10.

Figure 11:
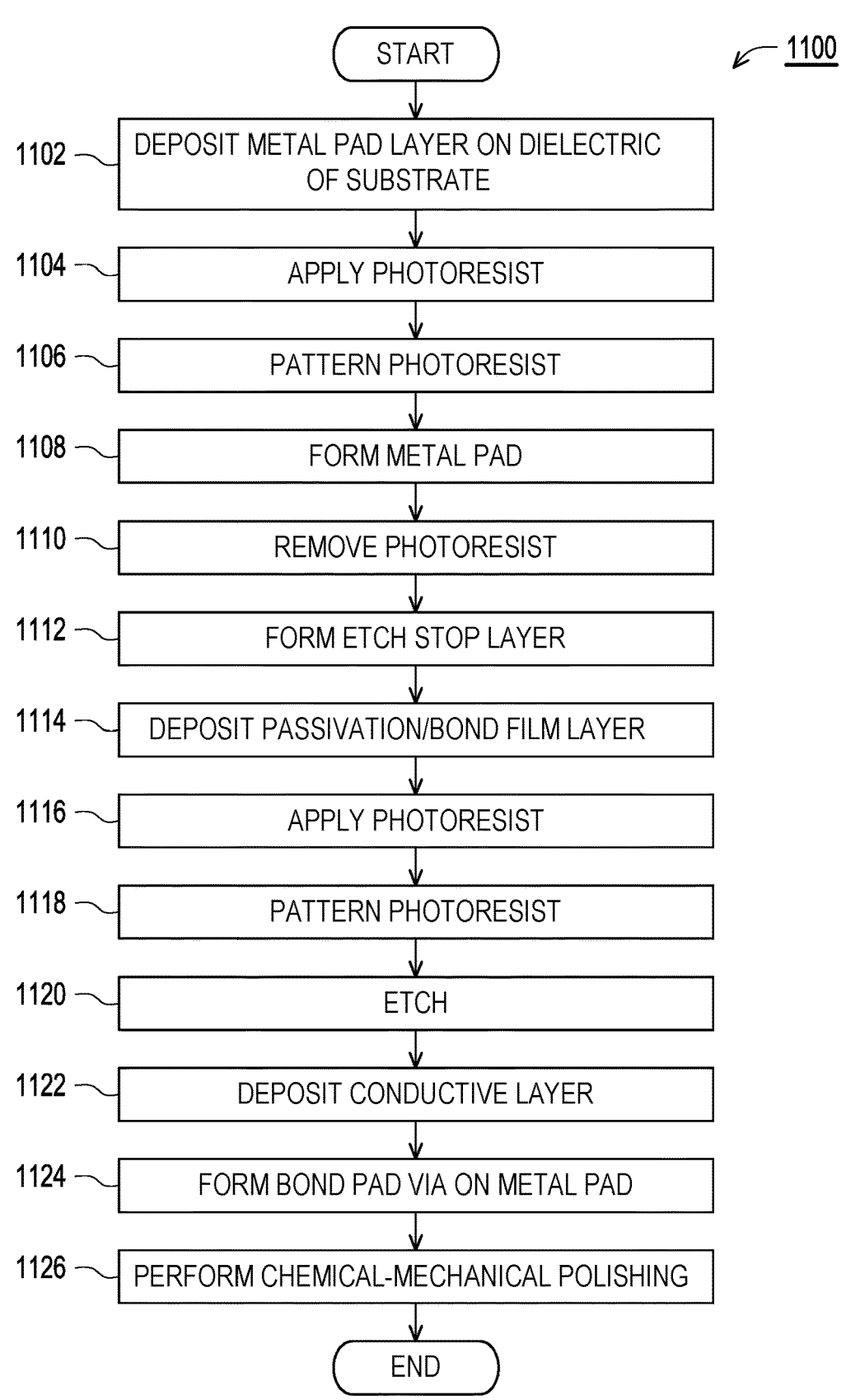
FIG. 11 is a flowchart illustrating a method for fabricating a semiconductor device in accordance with some embodiments.

Turning now to FIG. 11, there is shown a flowchart illustrating a method 1100 for fabricating a die component 102 of a semiconductor device 100 in accordance with some embodiments. The method of FIG. 11 begins at 1102, whereupon a metal pad layer 230 is deposited on a first die component 102. In some embodiments, the first die component 102 includes a dielectric layer 110 formed on first die substrate 108. In accordance with some embodiments, the metal pad layer 230 may comprise any suitable conductive material including, for example and without limitation, Al, Fe, Cu, Al—Cu, alloys thereof, or any other suitable material, as will be appreciated by the skilled artisan. It will be appreciated that deposition of the metal pad layer 230 may be accomplished by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

Previously formed in or on the first die substrate 102 is one or more first die devices 103. One or more electrically conductive components, e.g., the top metal component 112 and first die interconnection metals 113 are disposed within the dielectric layer 110, as illustrated in FIGS. 4A-4B, discussed in greater detail above. Further, as discussed in greater detail above, the dielectric layer 110 may be implemented as a suitable dielectric, i.e., insulative, material including, for example and without limitation, an oxide material (e.g., silicon dioxide ($SiO_2$) material), a nitride material (e.g., silicon nitride ($SiN_x$) material), or the like. In accordance with some embodiments, the top metal component 112 and/or first die interconnection metal 113 may comprise, for example, a suitable conductive metal including, for example and without limitation, copper, aluminum, iron, alloys thereof, etc., deposited via any of the suitable methods referenced above.

At step 1104, a photoresist is applied to the metal pad layer 230 and subsequently patterned at step 1106. The patterning of a layer may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In other embodiments, patterning of an electron-sensitive resist layer may be by way of electron beam exposure (electron beam lithography, i.e., e-beam lithography). The skilled artisan will appreciate that the foregoing are merely illustrative examples.

At step 1108, a metal pad 116 is formed from the metal pad layer 230. That is, the metal pad layer 230 uncovered by the photoresist applied and patterned at steps 1104-1106 is removed via etching, including, for example and without limitation, a dry etching process, a RIE process, a wet etching process, some other etching process, or a combination of the foregoing. The photoresist is then removed after forming the metal pad 116 at step 1110, resulting in the exposed metal pads 116 as shown in FIG. 4C.

An etch stop layer (ESL) 118 is then formed, e.g., deposited, on the metal pad 116 and exposed portions of the dielectric layer 110 at step 1112. In accordance with some embodiments, the etch stop layer (ESL) 118 may be implemented as tantalum oxide (TaO), tantalum (Ta), titanium (Ti), silicon nitride (SiN), or the like. It will be appreciated that the etch stop layer (ESL) 118 corresponds to a layer of material that has drastically different etching characteristics than the material to be etched, so as to stop or halt the etching processing of the layer deposited on the etch stop layer. FIG. 4D provides an illustrative example of the formation of the etch stop layer (ESL) 118 in accordance with one embodiment.

At step 1114, a passivation/bond film layer 232 is deposited on the etch stop layer (ESL) 118. In some embodiments, the passivation/bond film layer 232 comprises a polyimide material, or other suitable material having equivalent thermal stability, chemical resistance, and electrical properties. FIG. 4E provides an illustration of the formation of the passivation/bond film layer 232 in accordance with one example embodiment. At step 1116, a photoresist 234 is applied on the passivation/bond film layer 232. The photoresist 234 is then patterned, at step 1118, so as to selectively cover portions of the passivation/bond film layer 232, leaving exposed portions of passivation/bond film layer 232 proximate, i.e., above, the metal pad 116. FIG. 4F provides an illustration of the applied and patterned photoresist 234 of step 1118.

At step 1120, etching is performed to remove the exposed portions of the passivation/bond film layer 232 in accordance with the patterned photoresist layer 232. That is, removal of the unprotected portion of the passivation/bond layer 232 may be performed via an etching process implemented as a dry etching process, a RIE process, a wet etching process, some other etching process, or a combination of the foregoing. The same or different etching process may be implemented to remove the exposed portion of the etch stop layer 118, thereby exposing a portion of the metal pad 116. Subsequently, the same or different etching process, e.g., wet, dry, RIE, etc., may be performed on the exposed portion of the metal pad 116. FIG. 4G provides a representative depiction of the via regions 236 formed through the passivation/bond film layer 232 and/or etch stop layer (ESL) 118 to the metal pad 116.

A conductive layer (e.g., the bond pad metal layer 238) is then deposited on the first die component 102 at step 1122. The conductive layer (i.e., the bond pad metal layer 238) may be formed on the passivation/bond layer 232, extending through the via regions 236 to the metal pads 116. In accordance with some embodiments, the bond pad metal layer 238 may comprise, for example, a suitable conductive metal including, for example and without limitation, copper, aluminum, iron, alloys thereof, etc. The bond pad metal layer 238 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof. At step 1124, a bond pad via 120 is formed on the exposed portion of the metal pad 116. FIG. 4H provides a representative illustration of the resultant stage of fabrication of steps 1122-1124, wherein the bond pad vias 120 are formed on the expose portion of the metal pad 116 by deposition of the bond pad metal layer 238. Thereafter, at step 1126, chemical-mechanical polishing is performed on the first die component 102, removing a portion of the conductive layer 238, as illustrated in FIG. 4I.

Figure 12:
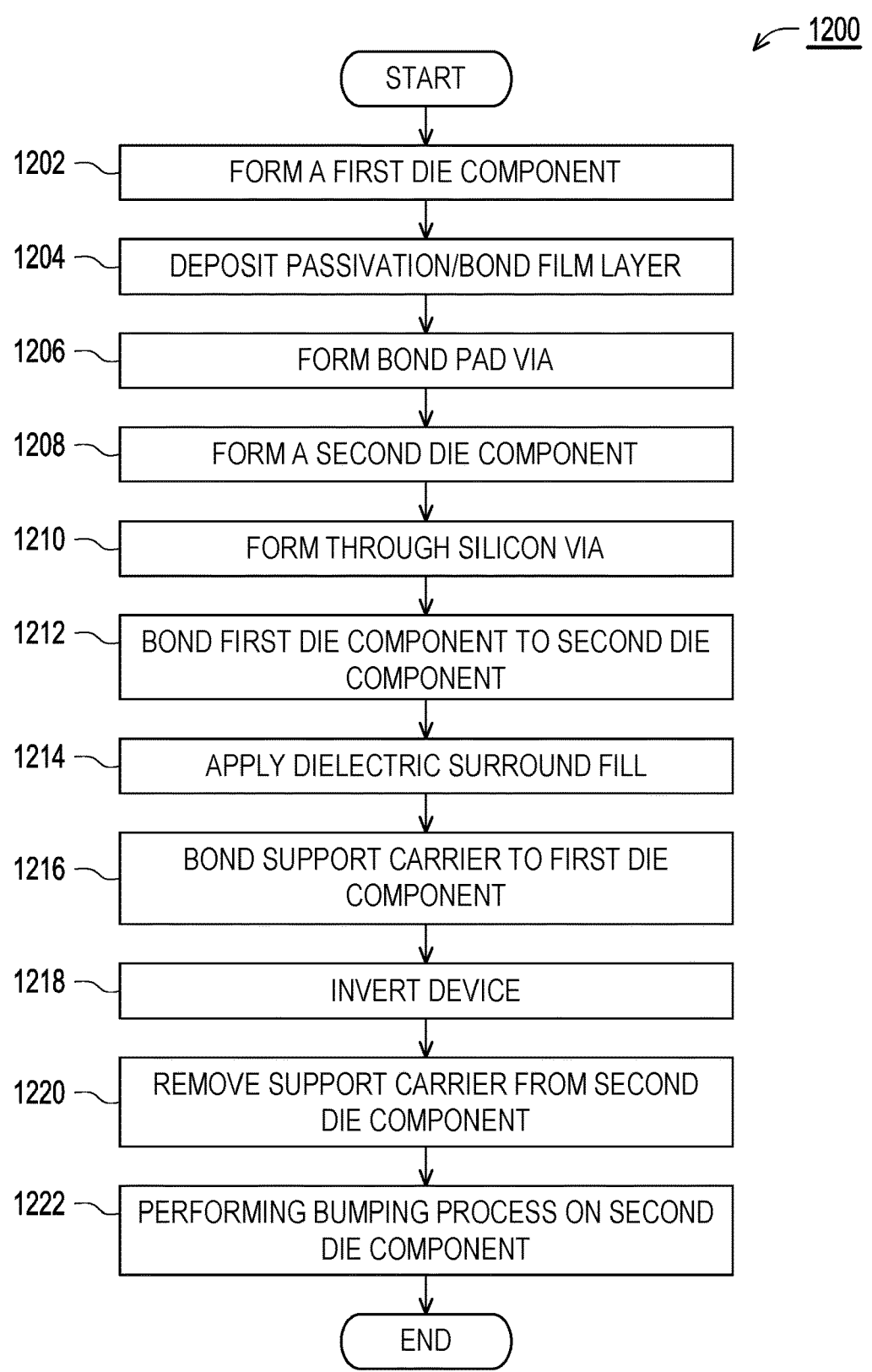
FIG. 12 is a flowchart illustrating a method for fabricating a semiconductor device in accordance with some embodiments.

Referring now to FIG. 12, there is shown a flowchart illustrating a method 1200 for fabricating a semiconductor device 100 in accordance with one embodiment. As shown in FIG. 12, the method 1200 begins by forming a first die component 102 at step 1202. In some embodiments, formation of the first die component 102 includes depositing, at step 1204, a passivation/bond film layer 232. FIG. 4E, as discussed above, provides one example illustration of the formation of the passivation/bond film layer 232 in accordance with some embodiments.

Thereafter, at step 1206, at least one bond pad via 120 is formed through the passivation/bond film layer 232 on at least one metal pad 116. As discussed in greater detail above, formation of the bond pad via 120 is illustrated in FIGS. 4F-4I, wherein photoresist 234 is applied and patterned on the passivation/bond film layer 232, etching is performed to create via regions 236 down through the passivation/bond film layer 232 to the metal pad 116, a conductive layer 238 is deposited, filling the via regions 236 so as to form the bond pad vias 120 on the metal pad 116 extending through the passivation/bond film layer 232, and chemical-mechanical polishing is performed to remove excess conductive layer 238.

At step 1208, a second die component 104 is formed. In some embodiments, formation of the second die component 104 includes, at step 1210, forming at least one through silicon via 128 through a second die substrate 126. FIGS. 5A-5B provide one example illustration of the formation and fabrication of the second die component 104. At step 1212, the first die component 102 is bonded to the second die component 104, forming the semiconductor device 100. FIG. 5C provides an illustration of the bonding of the first die component 102 to the second die component 104. At step 1214, a dielectric surround fill 124 is applied to the semiconductor device 100, as illustrated in FIG. 5D.

At step 1216, a support carrier 106 is bonded to the first die component 102, as illustrated in FIG. 5E. The semiconductor device 100 is then inverted, at step 1218, wherein the first die component 102 and support carrier 106 are now on the bottom, and the second die component 104 is position at the top for further processing. FIG. 5F illustrates this inversion, wherein the second die support carrier 240 is ready for removal. At step 1220, the second die support carrier 240 is removed as shown in FIG. 5G. Thereafter, at step 1222, bumping is performed on the second die component, resulting in the semiconductor device 100 depicted in FIG. 5H.

In some embodiments, it will be appreciated that the BPV landing 200 on metal pad 116 is one feature of System on Integrated Chips (SoIC) technology. However, formation of a BPV landing 200 on uneven surfaces of metal pads 116 may result in high resistance caused by over etching and conductive (i.e., copper) loss post thermal budget. Optimization of the BPV landing 200 decreases reliability risks. That is, the subject embodiments enhance thermal reliability (i.e., allows the components to take more thermal) while providing high performance reliability. Stated another way, the BPV landing 200 or occupied area of the top metal component is reduced in view of the direct contact of the BPV 120 to the metal pad 116. As such, the size and the amount of top metal component in the SoIC 100 is substantially reduced. See, e.g., FIGS. 3 and 10 for comparative illustration of the reduction in top metal component area. Thus, by BPV direct contact on the pad, the BPV occupied area (i.e., area of top metal impacted by BPV) is reduced and using specific design definitions of the SHDMiM/BPV KOZ (D1), metal pad recess (D2), and metal pad lateral recess (D3), thermal reliability is enhanced. In accordance with some embodiments, implementation of the optimized BPV landing 200 of the subject disclosure provides yield improvements of 5% or more, and in some embodiments, improvements of about 9%.

In accordance with a first embodiment, there is provided a method of fabricating a semiconductor device. The method includes forming a metal pad on a dielectric layer of a substrate, and forming an etch stop layer on the metal pad. The method also includes depositing a passivation/bond film layer on the etch stop layer, and patterning a photoresist layer on the passivation/bond film layer. A via region is thereby formed in the photoresist layer proximate to the metal pad. The method further includes etching a portion of the passivation/bond film layer to remove the portion in the via region, which exposes a portion of the metal pad. A bond pad via is then formed through the passivation/bond film layer in the via region, with the bond pad via contacting the exposed portion of the metal pad.

In accordance with a second embodiment, there is provided a method for fabricating a semiconductor device. The method includes forming a first die component, which includes depositing a passivation/bond film layer, and forming a bond pad via through the passivation/bond film layer such that the bond pad via is formed on a metal pad. The method further includes forming a second die component by forming a through silicon via through a second die substrate. In addition, the method includes bonding the first die component to the second die component, such that the bond pad via of the first die component contacts the through silicon via of the second die component.

In accordance with a third embodiment, there is provided a semiconductor device that includes a first die component and at least one second die component. The first die component includes a substrate, a dielectric layer on the substrate, and one or more metal pads positioned on the dielectric layer. The first die component further includes a passivation/bond film layer that is formed over the one or more metal pads, and one or more bond pad vias that extend through the passivation/bond film layer and contact one or more metal pads. The at least one second die component is bonded to the first die component and includes a substrate, and one or more through silicon vias, with the one or more through silicon vias contacting the one or more bond pad vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device comprising:

forming an interconnection metal structure within a dielectric layer formed on an integrated circuit (IC) substrate;

forming a metal-insulator-metal (MIM) component within the dielectric layer, the MIM component extending over a first portion of the interconnection metal structure;

forming at least one metal BPV landing pad on the dielectric layer, the at least one metal BPV landing pad extending over the MIM component and the at least one metal BPV landing pad extending over a second portion of the interconnection metal structure;

forming an etch stop layer on the at least one BPV landing metal pad;

depositing at least one of a passivation layer or bond film on the etch stop layer;

patterning a photoresist layer on the at least one passivation layer or bond film, wherein at least one via region is formed in the photoresist layer proximal to the at least one metal BPV landing pad;

etching the at least one passivation layer or bond film to remove a portion thereof in the at least one via region and exposing a portion of the at least one metal BPV landing pad; and forming at least one bond pad via through the at least one passivation layer or bond film in the at least one via region, the at least one bond pad via contacting the exposed portion of the at least one metal BPV landing pad, wherein the MIM component is laterally offset from the at least one bond pad via.

2. The method of claim 1, wherein the step of forming the at least one bond pad via further comprises:

depositing a conductive layer on the photoresist layer, wherein the conductive layer extends through the at least one via region to contact the at least one metal BPV landing pad, forming the at least one bond pad via therein; and performing chemical mechanical polishing to remove a portion of the conductive layer and a portion of the at least one passivation layer or bond film.

3. The method of claim 1, wherein the MIM component is a super high density metal-insulator-metal component, and the MIM component is laterally offset from the at least one bond pad via by a first distance D1 associated with a keep out zone (KOZ), the KOZ defined as a region around the at least one via region, adjacent to the first portion of the interconnection metal structure, and extending over the second portion of the interconnection metal structure.

4. The method of claim 3, wherein the KOZ is defined between an edge of the at least one super high-density metal-insulator-metal component and an edge of the at least one bond pad via.

5. The method of claim 4, wherein the KOZ has a range of greater than or equal to 5 μm.

6. The method of 3, wherein the at least one bond pad via has a metal BPV landing pad recess corresponding to a depth D2 into the at least one metal BPV landing pad into which the at least one bond pad via extends, wherein the metal BPV landing pad recess depth D2 is in the range of about 0 μm to about 0.1 μm.

7. The method of 3, wherein the at least one bond pad via has a metal BPV landing pad lateral recess corresponding to a distance D3 of bond pad material extending perpendicularly out from an edge of the at least one bond pad via, wherein the metal BPV landing pad lateral recess distance D3 is in the range of about 0 μm to about 0.1 μm.

8. The method of claim 3, wherein the dielectric layer on the interconnection metal structure includes at least one top metal component, and wherein the at least one metal BPV landing pad extends over the at least one top metal component.

9. A method of fabricating a semiconductor device, comprising:

forming a first die component comprising:

forming an interconnection metal structure within a dielectric layer formed on an integrated circuit (IC) substrate;

forming a metal-insulator-metal (MIM) component within the dielectric layer, the MIM component extending over a first portion of the interconnection metal structure;

forming a metal BPV landing pad on the dielectric layer, the metal BPV landing pad extending over the MIM component and the metal BPV landing pad extending over a second portion of the interconnection metal structure;

depositing at least one of a passivation layer or bond film over the metal BPV landing pad; and forming at least one bond pad via through the at least one of the passivation layer or bond film, the at least one bond pad via formed on at least one the metal BPV landing pad, wherein the MIM component is laterally offset from the at least one bond pad via;

forming a second die component comprising:

forming at least one through silicon via through a second die substrate; and bonding the first die component to the second die component, wherein the at least one bond pad via is contacting the at least one through silicon via.

10. The method of claim 9, wherein wherein the MIM component is laterally offset from the at least one bond pad via by a first distance D1 associated with a keep out zone (KOZ), the KOZ defined as a region around the at least one bond pad via region, adjacent to the first portion of the interconnection metal structure, and extending over the second portion of the interconnection metal structure.

11. The method of claim 10, wherein the KOZ is defined between an edge of the at least one super high-density metal-insulator-metal component and an edge of the at least one bond pad via.

12. The method of claim 11, wherein the KOZ has a range of greater than or equal to 5 μm.

13. The method of claim 10, wherein the at least one bond pad via has a metal BPV landing pad recess depth D2 in the range of about 0 μm to about 0.1 μm.

14. The method of claim 10, wherein the at least one bond pad via has a metal BPV landing pad lateral recess distance D3 in the range of about 0 μm to about 0.1 μm.

15. A semiconductor device comprising:

a first die component comprising:

a substrate, a dielectric layer disposed on the substrate, an interconnection metal structure formed within the dielectric layer, a metal-insulator-metal (MIM) component formed within the dielectric layer, the MIM component extending over a first portion of the interconnection metal structure;

a metal BPV landing pad disposed over the interconnection metal structure and disposed on the dielectric layer, the metal BPV landing pad extending over the MIM component and the metal BPV landing pad extending over a second portion of the interconnection metal structure, a passivation/bond film layer formed over the metal BPV landing pad, and a bond pad via, the bond pad via extending through the passivation/bond film layer and contacting the metal BPV landing pad, wherein the MIM component is laterally offset from the bond pad via; and at least one second die component bonded to the first die component, the second die component comprising:

a substrate, and at least one through silicon via;

wherein the at least one bond pad via contacts the at least one through silicon via.

16. The semiconductor device of claim 15, wherein the MIM component is a super high density metal-insulator-metal component and the super high-density metal-insulator-metal component is disposed in the dielectric layer in proximity to the metal BPV landing pad.

17. The semiconductor device of claim 16, wherein the MIM component is laterally offset from the bond pad via by a first distance D1 associated with a keep out zone (KOZ), the KOZ defined as a region around the bond pad via, adjacent to the first portion of the interconnection metal structure, and extending over the second portion of the interconnection metal structure, and the KOZ is further defined between an edge of the super high-density metal-insulator-metal component and an edge of the bond pad via.

18. The semiconductor device of claim 17, wherein the KOZ has a range of greater than or equal to 5 μm.

19. The semiconductor device of claim 15, wherein the bond pad via has a metal BPV landing pad recess in the range of about 0 μm to about 0.1 μm.

20. The semiconductor device of claim 15, wherein the bond pad via has a metal BPV landing pad lateral recess in the range of about 0 μm to about 0.1 μm.

* * * * *